US012603042B2

(12) United States Patent
Feng et al.

(10) Patent No.: US 12,603,042 B2
(45) Date of Patent: Apr. 14, 2026

(54) SHIFT REGISTER UNIT, GATE DRIVING CIRCUIT AND DISPLAY PANEL WITH PULL-UP VOLTAGE STABILIZING CIRCUITS

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 70 days.

(21) Appl. No.: 18/578,535

(22) PCT Filed: Mar. 20, 2023

(86) PCT No.: PCT/CN2023/082456
§ 371 (c)(1),
(2) Date: Jan. 11, 2024

(87) PCT Pub. No.: WO2024/192618
PCT Pub. Date: Sep. 26, 2024

(65) Prior Publication Data
US 2025/0232718 A1     Jul. 17, 2025

(51) Int. Cl.
*G09G 3/3225*     (2016.01)
*G09G 3/20*     (2006.01)
(Continued)

(52) U.S. Cl.
CPC ............. *G09G 3/3225* (2013.01); *G09G 3/20* (2013.01); *G09G 3/32* (2013.01); *G09G 3/3266* (2013.01);
(Continued)

(58) Field of Classification Search
CPC ................. G11C 19/28; G09G 3/3225; G09G 2300/0852; G09G 2310/0286;
(Continued)

(56) References Cited

U.S. PATENT DOCUMENTS

| | | | |
|---|---|---|---|
| 2013/0100007 A1* | 4/2013 | Yamamoto | ............... G09G 3/36 377/64 |
| 2017/0004790 A1 | 1/2017 | Kitsomboonloha et al. | |
| 2021/0201770 A1* | 7/2021 | Park | ........................ G11C 19/28 |
| 2021/0201807 A1* | 7/2021 | Feng | .................... G09G 3/3266 |

(Continued)

FOREIGN PATENT DOCUMENTS

| | | |
|---|---|---|
| CN | 102651207 A | 8/2012 |
| CN | 103198867 A | 7/2013 |

(Continued)

*Primary Examiner* — Adam J Snyder
(74) *Attorney, Agent, or Firm* — HOUTTEMAN LAW LLC

(57) ABSTRACT

A shift register unit is provided to include a shift register circuit having a display input circuit and at least two driving output circuits for sequentially outputting display driving pulses; each driving output circuit is configured to write a signal from a driving clock signal input terminal to a driving signal output terminal under a control of an active-level signal at a pull-up node; the shift register circuit further includes a first and/or a second pull-up voltage-stabilizing circuit; the first pull-up voltage-stabilizing circuit is connected to the pull-up node and at least configured to maintain a voltage at the pull-up node unchanged during a first driving output circuit outputs the display driving pulse; and the second pull-up voltage-stabilizing circuit is connected to the pull-up node and at least configured to maintain the voltage at the pull-up node unchanged during a last driving output circuit outputs the display driving pulse.

20 Claims, 25 Drawing Sheets

(51) Int. Cl.

| | |
|---|---|
| *G09G 3/32* | (2016.01) |
| *G09G 3/3266* | (2016.01) |
| *G09G 3/36* | (2006.01) |
| *G11C 19/28* | (2006.01) |

(52) U.S. Cl.
CPC ... *G09G 3/3677* (2013.01); *G09G 2300/0852* (2013.01); *G09G 2310/0286* (2013.01); *G09G 2310/08* (2013.01); *G09G 2320/043* (2013.01); *G11C 19/28* (2013.01)

(58) Field of Classification Search
CPC ......... G09G 2310/08; G09G 2320/043; G09G 3/20; G09G 3/32; G09G 3/3266; G09G 3/3677
See application file for complete search history.

(56) References Cited

U.S. PATENT DOCUMENTS

| | | | |
|---|---|---|---|
| 2021/0210017 A1 * | 7/2021 | Feng .................... | G11C 19/287 |
| 2022/0208109 A1 * | 6/2022 | Seo ...................... | G09G 3/3233 |
| 2024/0312391 A1 * | 9/2024 | Kim ........................ | G09G 3/20 |

FOREIGN PATENT DOCUMENTS

| | | | | | |
|---|---|---|---|---|---|
| CN | 101847387 | B | | 1/2014 | |
| CN | 104992663 | A | | 10/2015 | |
| CN | 108735176 | A | | 11/2018 | |
| CN | 109215552 | A | | 1/2019 | |
| CN | 109935184 | A | | 6/2019 | |
| CN | 109935198 | A | | 6/2019 | |
| CN | 109949749 | A | | 6/2019 | |
| CN | 110136653 | A | | 8/2019 | |
| KR | 1020130010715 | A | * | 1/2013 | ............ G11C 19/28 |
| KR | 101403855 | B1 | | 6/2014 | |

* cited by examiner

VDDA

VDDB

SHIFT REGISTER UNIT, GATE DRIVING CIRCUIT AND DISPLAY PANEL WITH PULL-UP VOLTAGE STABILIZING CIRCUITS

TECHNICAL FIELD

The present disclosure relates to the field of display technology, and in particular to a shift register unit, a gate driving circuit, and a display panel.

BACKGROUND

An active matrix organic light-emitting diode (AMOLED) panel is applied more and more widely. A pixel display device of the AMOLED is an organic light-emitting diode (OLED). A thin film transistor is driven to generate a driving current in a saturated state to drive a light-emitting device to emit light, so that the AMOLED can emit light.

SUMMARY

In a first aspect, embodiments of the present disclosure provide a shift register unit, including: a shift register circuit, wherein the shift register circuit includes: a display input circuit connected to a display signal input terminal and a pull-up node, and configured to write an active level signal to the pull-up node in response to an active level signal from the display signal input terminal; and at least two driving output circuits capable of sequentially outputting display driving pulses, wherein each driving output circuit is connected to the pull-up node, a driving clock signal input terminal and a driving signal output terminal, and is configured to write a signal from the driving clock signal input terminal to the driving signal output terminal in response to an active level signal at the pull-up node; the shift register circuit further includes at least one of a first pull-up voltage stabilizing circuit and a second pull-up voltage stabilizing circuit; the first pull-up voltage stabilizing circuit is connected to the pull-up node and at least configured to maintain a voltage at the pull-up node unchanged during a period in which a first one of the at least two driving output circuits outputs the display driving pulse; and the second pull-up voltage stabilizing circuit is connected to the pull-up node and at least configured to maintain the voltage at the pull-up node unchanged during a period in which a last one of the at least two driving output circuits outputs the display driving pulse.

In some embodiments, the first pull-up voltage stabilizing circuit and the second pull-up voltage stabilizing circuit are collectively configured to maintain the voltage at the pull-up node unchanged during periods in which the at least two driving output circuits output the display driving pulses.

In some embodiments, each driving output circuit includes: a driving output sub-circuit connected to the pull-up node, a corresponding driving clock signal input terminal and a corresponding driving signal output terminal, and configured to write a signal from the driving clock signal input terminal to the driving signal output terminal in response to an active level signal at the pull-up node; and a first capacitor including a first terminal connected to the pull-up node, and a second terminal connected to the driving signal output terminal.

In some embodiments, during the period in which the first driving output circuit outputs the display driving pulse, m other driving output circuits of the at least two driving output circuits sequentially start outputting the display driving pulses, m is a positive integer; the first pull-up voltage stabilizing circuit includes: m first voltage stabilizing sub-circuits in one-to-one correspondence with the m other driving output circuits; and each first voltage stabilizing sub-circuit is connected to the pull-up node and a corresponding first voltage stabilizing clock signal input terminal, and is configured to maintain the voltage at the pull-up node unchanged by a signal from the first voltage stabilizing clock signal input terminal and switching from a second level to a first level when the display driving pulse output by the driving output circuit corresponding to the first voltage stabilizing sub-circuit is switched from the first level to the second level.

In some embodiments, each first voltage stabilizing sub-circuit includes: a first transmission sub-circuit and a second capacitor; the first transmission sub-circuit is connected to the corresponding first voltage stabilizing clock signal input terminal, the pull-up node and a second terminal of the second capacitor, and is configured to write a signal from the first voltage stabilizing clock signal input terminal and switching from the second level to the first level to the second terminal of the second capacitor in response to an active level signal at the pull-up node when the display driving pulse output by the driving output circuit corresponding to the first transmission sub-circuit is switched from the first level to the second level; and a first terminal of the second capacitor is connected to the pull-up node.

In some embodiments, the first transmission sub-circuit includes: a fifty-first transistor; and a control electrode of the fifty-first transistor is connected to the pull-up node, a first electrode of the fifty-first transistor is connected to the corresponding first voltage stabilizing clock signal input terminal, and a second electrode of the fifty-first transistor is connected to the second terminal of the second capacitor.

In some embodiments, each driving output circuit includes a driving output sub-circuit and a first capacitor; and the second capacitor has a same capacitance value as the first capacitor.

In some embodiments, the shift register circuit further includes: a pull-down control circuit connected to a second power supply terminal, an active level supply terminal, the pull-up node, and a pull-down node, and configured to write, to the pull-down node, a voltage with a phase opposite to that of the voltage at the pull-up node; and each first voltage stabilizing sub-circuit further includes: a first reset sub-circuit connected to the pull-down node, the second terminal of the second capacitor, and a fourth power supply terminal, and configured to write a non-active level signal from the fourth power supply terminal to the second terminal of the second capacitor in response to an active level signal at the pull-down node.

In some embodiments, the first reset sub-circuit includes: a sixty-first transistor; and a control electrode of the sixty-first transistor is connected to the pull-down node, a first electrode of the sixty-first transistor is connected to the second terminal of the second capacitor, and a second electrode of the sixty-first transistor is connected to the second power supply terminal.

In some embodiments, during the period in which the last driving output circuit outputs the display driving pulse, n other driving output circuits of the at least two driving output circuits sequentially finish outputting the display driving pulses, n is a positive integer; the second pull-up voltage stabilizing circuit includes: n second voltage stabilizing sub-circuits in one-to-one correspondence with the n other driving output circuits; and each second voltage stabilizing sub-circuit is connected to the pull-up node and a corresponding second voltage stabilizing clock signal input terminal, and is configured to maintain the voltage at the pull-up node unchanged according to a signal from the second voltage stabilizing clock signal input terminal and switching from the first level to the second level when the display driving pulse output by the driving output circuit corresponding to the second voltage stabilizing sub-circuit is switched from the second level to the first level.

In some embodiments, each second voltage stabilizing sub-circuit includes: a second transmission sub-circuit and a third capacitor; the second transmission sub-circuit is connected to the corresponding second voltage stabilizing clock signal input terminal, the pull-up node and a second terminal of the third capacitor, and is configured to write a signal from the second voltage stabilizing clock signal input terminal and switching from the first level to the second level to the second terminal of the third capacitor in response to an active level signal at the pull-up node when the display driving pulse output by the driving output circuit corresponding to the second transmission sub-circuit is switched from the second level to the first level; and a first terminal of the third capacitor is connected to the pull-up node.

In some embodiments, the second transmission sub-circuit includes: a fifty-second transistor; and a control electrode of the fifty-second transistor is connected to the pull-up node, a first electrode of the fifty-second transistor is connected to the corresponding first voltage stabilizing clock signal input terminal, and a second electrode of the fifty-second transistor is connected to the second terminal of the third capacitor.

In some embodiments, each driving output circuit includes a driving output sub-circuit and a first capacitor; and the third capacitor has a same capacitance value as the first capacitor.

In some embodiments, the shift register circuit further includes: a pull-down control circuit connected to the second power supply terminal, the active level supply terminal, the pull-up node, and the pull-down node, and configured to write, to the pull-down node, a voltage with a phase opposite to that of the voltage at the pull-up node; and each second voltage stabilizing sub-circuit further includes: a second reset sub-circuit connected to the pull-down node, the second terminal of the third capacitor, and the fourth power supply terminal, and configured to write a non-active level signal from the fourth power supply terminal to the second terminal of the third capacitor in response to an active level signal at the pull-down node.

In some embodiments, the second reset sub-circuit includes: a sixty-second transistor; and a control electrode of the sixty-second transistor is connected to the pull-down node, a first electrode of the sixty-second transistor is connected to the second terminal of the third capacitor, and a second electrode of the sixty-second transistor is connected to the second power supply terminal.

In some embodiments, the shift register circuit further includes: at least one cascade output circuit; and the at least one cascade output circuit is connected to the pull-up node, a corresponding cascade clock signal input terminal and a corresponding cascade signal output terminal, and is configured to write a signal from the cascade clock signal input terminal to the cascade signal output terminal in response to a voltage at the pull-up node.

In some embodiments, the shift register circuit further includes: a pull-down control circuit connected to the second power supply terminal, the active level supply terminal, the pull-up node, and the pull-down node, and configured to write, to the pull-down node, a voltage with a phase opposite to that of the voltage at the pull-up node; and the at least one cascade output circuit is further connected to the pull-down node and the second power supply terminal, and is further configured to write a non-active level signal from the second power supply terminal to the cascade signal output terminal in response to a voltage at the pull-down node.

In some embodiments, the shift register circuit further includes: a display reset circuit connected to a display reset signal input terminal, the second power supply terminal, and the pull-up node, and configured to write a non-active level signal from the second power supply terminal to the pull-up node in response to an active level signal from the display reset signal input terminal; and the at least one cascade output circuit includes two cascade output circuits, one of the two cascade output circuits is configured to output a reset cascade pulse, and the other one of the two cascade output circuits is configured to output an input cascade pulse.

In some embodiments, a moment at which the cascade output circuit configured to output the reset cascade pulse starts outputting the reset cascade pulse precedes a moment at which the cascade output circuit configured to output the input cascade pulse starts outputting the input cascade pulse.

In some embodiments, the shift register circuit further includes: a display reset circuit connected to a display reset signal input terminal, the second power supply terminal, and the pull-up node, and configured to write a non-active level signal from the second power supply terminal to the pull-up node in response to an active level signal from the display reset signal input terminal; and a pull-down control circuit connected to the second power supply terminal, the active level supply terminal, the pull-up node, and the pull-down node, and configured to write, to the pull-down node, a voltage with a phase opposite to that of the voltage at the pull-up node; each driving output sub-circuit is further connected to the pull-down node and the fourth power supply terminal, and is further configured to write a non-active level signal from the fourth power supply terminal to the driving signal output terminal in response to an active level signal at the pull-down node.

In some embodiments, the shift register circuit includes two pull-down control circuits, which are a first pull-down control circuit and a second pull-down control circuit, respectively; the shift register circuit includes two pull-down nodes, which are a first pull-down node and a second pull-down node, respectively; the shift register circuit includes two active level supply terminals, which are a first active level supply terminal and a second active level supply terminal, respectively; the first pull-down control circuit is connected to the first pull-down node and the first active level supply terminal, and the second pull-down control circuit is connected to the second pull-down node and the second active level supply terminal; and each driving output sub-circuit is connected to both the first pull-down node and the second pull-down node, and is configured to write a non-active level signal from the fourth power supply terminal to the driving signal output terminal when at least one of the first pull-down node and the second pull-down node is at an active level.

In some embodiments, the pull-down control circuit includes: a thirty-seventh transistor, a thirty-eighth transistor, a thirty-ninth transistor, and a fortieth transistor; a control electrode of the thirty-seventh transistor is connected to the active level supply terminal, a first electrode of the thirty-seventh transistor is connected to the control electrode of the thirty-seventh transistor, and a second electrode of the thirty-seventh transistor is connected to a control electrode of the thirty-eighth transistor; the control electrode of the thirty-eighth transistor is connected to a first electrode of the fortieth transistor, a first electrode of the thirty-eighth transistor is connected to the active level supply terminal, and a second electrode of the thirty-eighth transistor is connected to the pull-down node; a control electrode of the thirty-ninth transistor is connected to the pull-up node, a first electrode of the thirty-ninth transistor is connected to the pull-down node, and a second electrode of the thirty-ninth transistor is connected to a fifth power supply terminal; and a control electrode of the fortieth transistor is connected to the pull-up node, and a second electrode of the fortieth transistor is connected to the second power supply terminal.

In some embodiments, the pull-down control circuit further includes: a forty-first transistor; the second electrode of the thirty-seventh transistor is connected to the control electrode of the thirty-eighth transistor through the forty-first transistor; and a control electrode of the forty-first transistor is connected to the control electrode of the thirty-seventh transistor, a first electrode of the forty-first transistor is connected to the second electrode of the thirty-seventh transistor, and a second electrode of the forty-first transistor is connected to the control electrode of the thirty-eighth transistor.

In some embodiments, the shift register circuit further includes: a display input auxiliary circuit; the display input circuit is connected to the pull-up node through the display input auxiliary circuit, and the display input circuit and the display input auxiliary circuit are connected to each other at a display intermediate node; and the display input auxiliary circuit is further connected to a sixth power supply terminal, the display signal input terminal and the pull-up node, and is configured to write an active level signal from the sixth power supply terminal to the pull-up node in response to an active level signal from the display signal input terminal, and to electrically disconnect the display intermediate node from the pull-up node in response to a non-active level signal from the random signal input terminal, and to write the active level signal from the sixth power supply terminal to the display intermediate node.

In some embodiments, the display input auxiliary circuit includes: a forty-second transistor and a forty-third transistor; a control electrode of the forty-second transistor is connected to the display signal input terminal, a first electrode of the forty-second transistor is connected to the display intermediate node, and a second electrode of the forty-second transistor is connected to the pull-up node; and a control electrode of the forty-third transistor is connected to the sixth power supply terminal, a first electrode of the forty-third transistor is connected to the control electrode of the forty-third transistor, and a second electrode of the forty-third transistor is connected to the display intermediate node.

In some embodiments, the display input auxiliary circuit further includes: a forty-fourth transistor through which the second electrode of the forty-third transistor is connected to the display intermediate node; and a control electrode of the forty-fourth transistor is connected to the control electrode of the forty-third transistor, a first electrode of the forty-fourth transistor is connected to a second electrode of the forty-fourth transistor, and the second electrode of the forty-fourth transistor is connected to the display intermediate node.

In some embodiments, the shift register circuit further includes: a sensing control circuit and a sensing input circuit; the sensing control circuit is connected to a sensing control node, a sensing signal input terminal and the random signal input terminal, and is configured to write a signal from the sensing signal input terminal to the sensing control node in response to an active level signal from the random signal input terminal; and the sensing input circuit is connected to the sensing control node, a clock control signal input terminal, a sensing intermediate node and the pull-up node, and is configured to write an active level signal to the sensing intermediate node in response to an active level signal at the sensing control node, and to form a conductive path between the sensing intermediate node and the pull-up node in response to an active level signal from the clock control signal input terminal.

In some embodiments, the shift register circuit further includes: a sensing control leakage preventing circuit; and the sensing control circuit is connected to the sensing control node through the sensing control leakage preventing circuit; the sensing control leakage preventing circuit and the sensing control circuit are connected to each other at a sensing control leakage preventing node; the sensing control leakage preventing circuit is further connected to the first power supply terminal, the sensing control node and the random signal input terminal, and is configured to write an active level signal from the first power supply terminal to the sensing control leakage preventing node in response to an active level signal at the sensing control node, and is further configured to electrically connect the sensing control leakage preventing node and the sensing control node in response to an active level signal from the random signal input terminal, and electrically disconnect the sensing control leakage preventing node from the sensing control node in response to a non-active level signal from the random signal input terminal.

In some embodiments, the shift register circuit further includes: a first voltage control circuit connected to a third power supply terminal, the pull-up node and a first voltage control node, and configured to write an active level signal from the third power supply terminal to the first voltage control node in response to an active level signal at the pull-up node; the shift register further includes: a sensing input leakage preventing circuit; and the sensing input circuit is connected to the pull-up node through the sensing input leakage preventing circuit; the sensing input circuit and the sensing input leakage preventing circuit are connected to each other at a sensing input leakage preventing node; the sensing input leakage preventing node is connected to the first voltage control node; the sensing input leakage preventing circuit is connected to the clock control signal input terminal, and is configured to electrically connect the sensing input leakage preventing node and the pull-up node in response to an active level signal from the clock control signal input terminal, and to electrically disconnect the sensing input leakage preventing node from the pull-up node in response to a non-active level signal from the clock control signal input terminal.

In some embodiments, the sensing input circuit includes: a first input sub-circuit connected to the sensing control node and the sensing intermediate node and configured to write an active level signal to the sensing intermediate node in response to an active level signal at the sensing control node; a second input sub-circuit connected to the sensing intermediate node and the clock control signal input terminal, and configured to electrically connect the sensing intermediate node and the pull-up node in response to an active level signal from the clock control signal input terminal; and the shift register unit includes two shift register circuits, which share the same sensing control circuit and the same first input sub-circuit.

In some embodiments, each shift register circuit further includes: a display reset circuit connected to a display reset signal input terminal, the second power supply terminal, and the pull-up node, and configured to write a non-active level signal from the second power supply terminal to the pull-up node in response to an active level signal from the display reset signal input terminal; a pull-down control circuit connected to the second power supply terminal, the active level supply terminal, the pull-up node, and the pull-down node, and configured to write, to the pull-down node, a voltage with a phase opposite to that of the voltage at the pull-up node; a pull-up noise reduction circuit connected to the second power supply terminal, the pull-up node and the pull-down node, and configured to write a non-active level signal from the second power supply terminal to the pull-up node in response to an active level signal at the pull-down node; and a global reset circuit connected to a global reset signal input terminal, the second power supply terminal, and the pull-up node, and configured to write a non-active level signal from the second power supply terminal to the pull-up node in response to an active level signal from the global reset signal input terminal; the driving output sub-circuit is further connected to the pull-down node and the fourth power supply terminal, and is further configured to write a non-active level signal from the fourth power supply terminal to the driving signal output terminal in response to an active level signal at the pull-down node.

In some embodiments, the shift register circuit further includes: a first voltage control circuit connected to a third power supply terminal, the pull-up node and a first voltage control node, and configured to write an active level signal from the third power supply terminal to the first voltage control node in response to an active level signal at the pull-up node; the shift register circuit further includes: at least one of a first leakage preventing circuit, a second leakage preventing circuit, and a third leakage preventing circuit; the global reset circuit is connected to the second power supply terminal through the first leakage preventing circuit; the global reset circuit is connected to the first leakage preventing circuit at a first leakage preventing node; the first leakage preventing node is connected to the first voltage control node; the first leakage preventing circuit is connected to the global reset signal input terminal, and is configured to electrically connect the first leakage preventing node and the second power supply terminal in response to an active level signal from the global reset signal input terminal, and electrically disconnect the first leakage preventing node from the second power supply terminal in response to a non-active level signal from the global reset signal input terminal; the display reset circuit is connected to the second power supply terminal through the second leakage preventing circuit; the display reset circuit and the second leakage preventing circuit are connected to each other at a second leakage preventing node; the second leakage preventing node is connected to the first voltage control node; the second leakage preventing circuit is connected to the display reset signal input terminal, and is configured to electrically connect the second leakage preventing node and the second power supply terminal in response to an active level signal from the display reset signal input terminal, and to electrically disconnect the second leakage preventing node from the second power supply terminal in response to a non-active level signal from the display reset signal input terminal; and the pull-up noise reduction circuit is connected to the second power supply terminal through the third leakage preventing circuit; the pull-up noise reduction circuit is connected to the third leakage preventing circuit at a third leakage preventing node; the third leakage preventing node is connected to the first voltage control node; the third leakage preventing circuit is connected to the pull-down node, and is configured to form a conductive path between the third leakage preventing node and the second power supply terminal in response to an active level signal at the pull-down node, and to electrically disconnect the third leakage preventing node from the second power supply terminal in response to a non-active level signal at the pull-down node.

In a second aspect, embodiments of the present disclosure provide a gate driving circuit, including: a plurality of the shift register units as provided in the first aspect, a plurality of the shift register circuits of the plurality of the shift register units are cascaded.

In some embodiments, the gate driving circuit further includes: a plurality of clock supply signal lines capable of sequentially providing clock pulses; the driving clock signal input terminal of each driving output circuit is connected to the corresponding clock supply signal line; and the first voltage stabilizing clock signal input terminal of the first voltage stabilizing sub-circuit is connected to the corresponding clock supply signal line.

In some embodiments, the gate driving circuit further includes: a plurality of clock supply signal lines capable of sequentially providing clock pulses; the driving clock signal input terminal of each driving output circuit is connected to the corresponding clock supply signal line; and the second voltage stabilizing clock signal input terminal of the second voltage stabilizing sub-circuit is connected to the corresponding clock supply signal line.

In a third aspect, embodiments of the present disclosure provide a display panel, including: a base substrate and a gate driving circuit on the base substrate; and the gate driving circuit is the gate driving circuit provided in the second aspect.

DETAIL DESCRIPTION OF EMBODIMENTS

In order to enable one of ordinary skill in the art to better understand the technical solutions of the present disclosure, a shift register unit, a gate driving circuit, and a display panel provided by the present disclosure will be described in further detail with reference to the accompanying drawings.

The terms "first", "second" and the like used in embodiments of the present disclosure are not intended to indicate any order, quantity, or importance, but rather are used for distinguishing one element from another. The term "comprising", "including", or the like means that the element or item preceding the term contains the element or item listed after the term and its equivalent, but does not exclude other elements or items. The term "connected", "coupled" or the like is not limited to physical or mechanical connections, but may include electrical connections, whether direct or indirect connections.

A transistor in the embodiments of the present disclosure may be a thin film transistor, a field effect transistor or any other device having the same characteristics. In the embodiments, a drain electrode and a source electrode of each transistor may be interchangeable, and therefore there is no difference between the drain electrode and the source electrode of the transistor in the embodiments of the present disclosure. Herein, only in order to distinguish the two electrodes of the transistor except for a control electrode (i.e., a gate electrode), one of the electrodes is referred to as a drain electrode, and the other electrode is referred to as a source electrode. The thin film transistors in the embodiments of the present disclosure may be N-type transistors or P-type transistors. In the embodiments of the present disclosure, when an N-type thin film transistor is used, a first electrode thereof may be a source electrode, and a second electrode thereof may be a drain electrode.

In the present disclosure, an "active level signal" refers to a signal that can control a transistor to be turned on after input to a control electrode of the transistor, and a "non-active level signal" refers to a signal that can control a transistor to be turned off after input to a control electrode of the transistor. For an N-type transistor, a high level signal is an active level signal, and a low level signal is a non-active level signal; for a P-type transistor, a low level signal is an active level signal and a high level signal is a non-active level signal.

In the following description, a case where the transistor is an N-type transistor will be described as an example, and an active level signal refers to a high level signal and a non-active level signal refers to a low level signal. It is conceivable that when a P-type transistor is employed, the timing of the control signal needs to be adjusted accordingly. Specific details are not set forth herein but are to be understood as being within the scope of the present disclosure.

Figure 1:
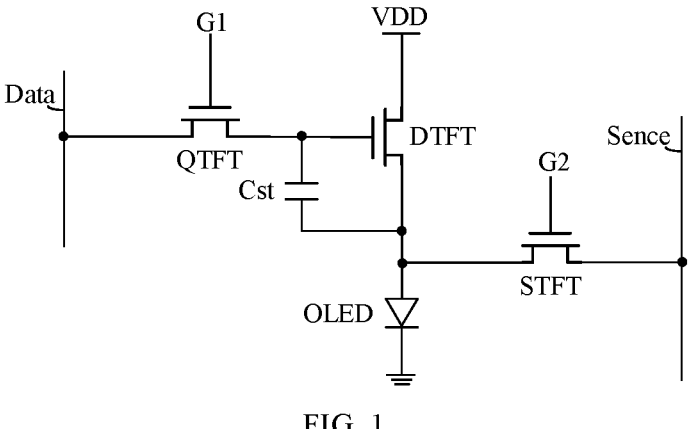
FIG. 1 is a schematic diagram of a circuit structure of a pixel circuit in an organic light-emitting diode display panel.
Figure 2:
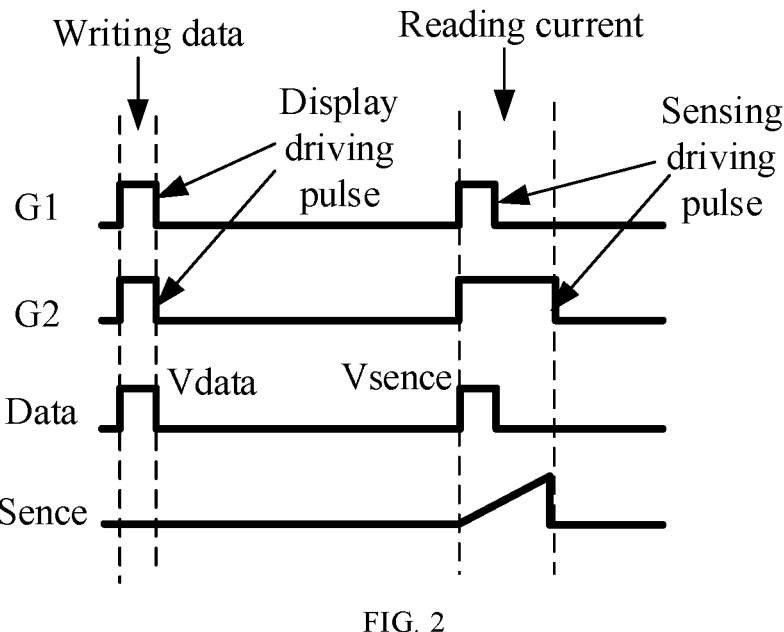
FIG. 2 is a timing diagram illustrating an operation of the pixel circuit shown in FIG. 1.

FIG. 1 is a schematic diagram of a circuit structure of a pixel circuit in an organic light-emitting diode display panel; FIG. 2 is a timing diagram illustrating an operation of the pixel circuit shown in FIG. 1. As shown in FIGS. 1 and 2, for an organic light-emitting diode display panel with an external compensation function, one frame of picture may be divided into two phases: a display driving phase and a sensing driving phase; in the display driving phase, the display driving is completed for pixel units in rows in the display panel; in the sensing driving phase, the current drawing (i.e., the sensing) is completed for pixel units in a row in the display panel.

Referring to FIG. 1, the pixel circuit includes a display switching transistor QTFT (a control electrode of the display switching transistor QTFT is connected to a first gate line G1), a driving transistor DTFT, a sensing switching transistor STFT (a control electrode of the sensing switching transistor STFT is connected to a second gate line G2), and a capacitor Cst. When the external compensation function is required to be carried out on the pixel circuit, an operating process of the pixel circuit at least includes the following two phases: the display driving phase (including a data voltage writing process) and the sensing driving phase (including a current reading process).

In the display driving phase, it is necessary to write a data voltage Vdata in a data line Data to the pixel units; in the sensing driving phase, it is necessary to write a test voltage Vsence to the pixel units through the data line Data, and read an electrical signal at a drain electrode of the driving transistor to a signal reading line Sence through the sensing switching transistor STFT. In the current reading process, it is necessary to write an active level voltage to a gate electrode of the sensing switching transistor STFT through the corresponding second gate line G2. It should be noted that the specific compensation process and the specific compensation principle for performing the external compensation on the pixel units in the OLED display panel are not described herein again.

For the first gate line G1 for controlling the display switching transistor QTFT and the second gate line G2 for controlling the sensing switching transistor STFT, corresponding gate driving circuits are respectively provided in a peripheral region of the display panel, and each gate driving circuit includes a plurality of cascaded shift register units, and driving signals may be provided to the corresponding gate line through the shift register units.

Figures 3, 4:
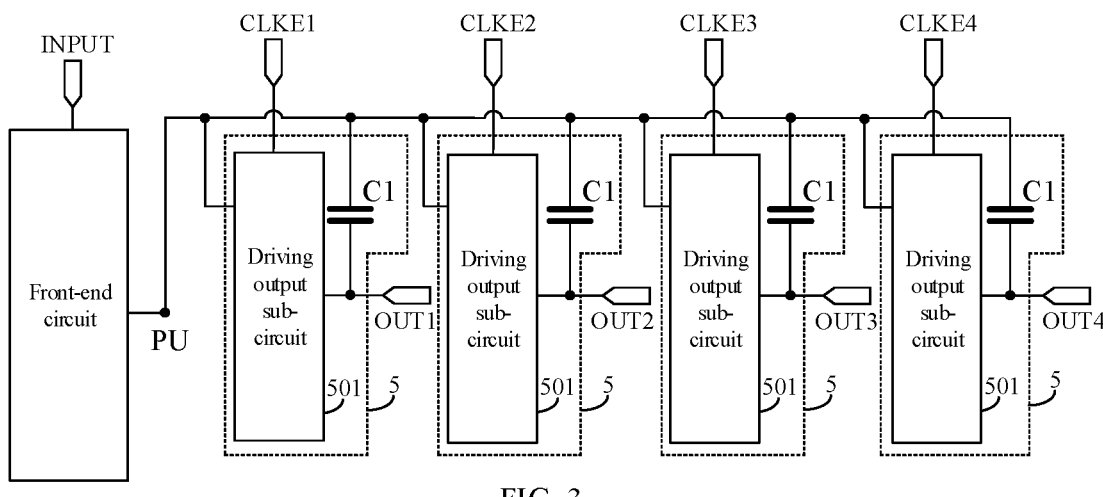
FIG. 3 is a schematic diagram of a circuit structure of a shift register unit in the related art.
FIG. 4 is a timing diagram illustrating an operation of a shift register in the related art.

FIG. 3 is a schematic diagram of a circuit structure of a shift register unit in the related art; FIG. 4 is a timing diagram illustrating an operation of a shift register in the related art. As shown in FIGS. 3 and 4, each shift register unit includes a shift register circuit, which includes a front end circuit and driving output circuits; the front end circuit and the driving output circuits are both connected to a pull-up node; the front end circuit may be used to control a voltage at the pull-up node, and each driving output circuit includes: a driving output sub-circuit 501 and a first capacitor C1, wherein a first terminal of the first capacitor C1 is connected to the pull-up node PU, a second terminal of the first capacitor C1 is connected to a corresponding one of driving signal output terminals OUT1 to OUT4; the driving output sub-circuit 501 includes an output transistor (not shown), a control electrode of the output transistor is connected to the pull-up node; when the voltage at the pull-up node is at an active level, the output transistor writes a signal provided by a corresponding driving clock signal input terminal to a corresponding one of the driving signal output terminals OUT1 to OUT4, which may output a corresponding driving pulse.

In the related art, in order to reduce the overall space occupied by the gate driving circuits, at least two driving output circuits 5 are disposed in each shift register circuit, and at this time, each shift register circuit may provide driving pulses for two or more gate lines, so that the number of shift register circuits required to be disposed in the gate driving circuits is reduced, thereby reducing the overall space occupied by the gate driving circuits. Referring to FIG. 3, FIG. 3 illustrates that each shift register circuit includes four driving output circuits 5 and corresponding four driving signal output terminals OUT1 to OUT4.

As shown in FIG. 4, in order to ensure that the data voltages in the pixel circuit may be written accurately, each display driving pulse output by the shift register circuits necessarily has a certain pulse width. In order to ensure that the driving may be completed for pixel circuits in all rows within one frame, any two adjacent display driving pulses may partially overlap with each other.

Taking the example shown in FIG. 4 as an example, the four driving signal output terminals OUT1 to OUT4 sequentially output display driving pulses, and the display driving pulses output by any two adjacent driving signal output terminals overlap with each other. FIG. 4 exemplarily shows that an overlap ratio/rate (a ratio of a width of the overlapping portion to a pulse width of one display driving pulse) of any two adjacent display driving pulses is 50%.

At rising edges and falling edges of the display driving pulses output by the driving signal output terminals OUT1 to OUT4, the bootstrap effect of the first capacitor C1 has an influence on the voltage at the pull-up node PU. The situation shown in FIG. 4 is taken as an example.

At a rising edge of the display driving pulse output by the first driving signal output terminal OUT1, the first capacitor C1 connected to the first driving signal output terminal OUT1 pulls up the voltage at the pull-up node PU, so that the voltage at the pull-up node PU rises.

At a rising edge of the display driving pulse output by the second driving signal output terminal OUT2, the first capacitor C1 connected to the second driving signal output terminal OUT2 pulls up the voltage at the pull-up node PU, so that the voltage at the pull-up node PU further rises.

At a falling edge of the display driving pulse output by the first driving signal output terminal OUT1, and at a rising edge of the display driving pulse output synchronously by the third driving signal output terminal OUT3, the first capacitor C1 connected to the first driving signal output terminal OUT1 pulls down the voltage at the pull-up node PU, and the first capacitor C1 connected to the third driving signal output terminal OUT3 pulls up the voltage at the pull-up node PU, so that the voltage at the pull-up node PU remains unchanged.

At a falling edge of the display driving pulse output by the second driving signal output terminal OUT2, and at a rising edge of the display driving pulse output synchronously by the fourth driving signal output terminal OUT4, the first capacitor C1 connected to the second driving signal output terminal OUT2 pulls down the voltage at the pull-up node PU, and the first capacitor C1 connected to the fourth driving signal output terminal OUT4 pulls up the voltage at the pull-up node PU, so that the voltage at the pull-up node PU remains unchanged.

At a falling edge of the display driving pulse output by the third driving signal output terminal OUT3, the first capacitor C1 connected to the third driving signal output terminal OUT3 pulls down the voltage at the pull-up node PU, so that the voltage at the pull-up node PU falls.

At a falling edge of the display driving pulse output by the fourth driving signal output terminal OUT4, the first capacitor C1 connected to the fourth driving signal output terminal OUT4 pulls down the voltage at the pull-up node PU, so that the voltage at the pull-up node PU falls.

As can be seen from FIG. 4, there is a rising jump of the voltage at the pull-up node PU during a period in which the first driving signal output terminal OUT1 outputs the display driving pulse; the voltage at the pull-up node PU remains unchanged (which is equal to the voltage at the pull-up node PU during the latter half of the period in which the first driving signal output terminal OUT1 outputs the display driving pulse) during a period in which the second driving signal output terminal OUT2 outputs the display driving pulse; the voltage at the pull-up node PU remains unchanged (which is equal to the voltage at the pull-up node PU during the latter half of the period in which the first driving signal output terminal OUT1 outputs the display driving pulse) during a period in which the third driving signal output terminal OUT3 outputs the display driving pulse; and there is a falling jump of the voltage at the pull-up node PU during a period in which the fourth driving signal output terminal OUT4 outputs the display driving pulse. Therefore, (a condition of) the voltage at the pull-up node PU when the second driving signal output terminal OUT2 outputs the display driving pulse is the same as that when the third driving signal output terminal OUT3 outputs the display driving pulse; the voltage at the pull-up node PU when the first driving signal output terminal OUT1 outputs the display driving pulse and the voltage at the pull-up node PU when the fourth driving signal output terminal OUT4 outputs the display driving pulse are different from those when the second driving signal output terminal OUT2 outputs the display driving pulse and when the third driving signal output terminal OUT3 outputs the display driving pulse.

Since the voltage at the pull-up node directly affects actual waveforms of the display driving pulses output from the respective driving signal output terminals OUT1 to OUT4, the actual waveform of the display driving pulse output from the second driving signal output terminal OUT2 is the same as that of the display driving pulse output from the third driving signal output terminal OUT3, the actual waveform of the display driving pulse output from the first driving signal output terminal OUT1 is different from that output from each of the second driving signal output terminal OUT2 and the third driving signal output terminal OUT3, and the actual waveform of the display driving pulse output from the fourth driving signal output terminal OUT4 is different from is different from that output from each of the second driving signal output terminal OUT2 and the third driving signal output terminal OUT3. That is, there is a problem that the waveforms of the display driving pulses output by different driving output circuits in the same shift register circuit are different from each other. A difference among the waveforms of the display driving pulses causes a certain difference in the driving process of the pixel circuit and finally causes "horizontal stripes" on the display panel.

In practical applications, it is found that generally, the actual waveform of the display driving pulse output by the first driving output circuit in the shift register circuit is different from the actual waveforms of the display driving pulses output by the other driving output circuits, and the actual waveform of the display driving pulse output by the last driving output circuit in the shift register circuit is different from the actual waveforms of the display driving pulses output by the other driving output circuits.

Specifically, when the number of the driving output circuits in the shift register circuit is two, the actual waveforms of the display driving pulses output by the two driving output circuits are different from each other; when the number of the driving output circuits in the shift register circuit is N and N is an integer greater than two, the actual waveform of the display driving pulse output by the first driving output circuit is different from the actual waveforms of the display driving pulses output by the second to Nth driving output circuits, and the actual waveform of the display driving pulse output by the Nth (i.e., last) driving output circuit is different from the actual waveforms of the display driving pulses output by the first to (N−1)th driving output circuits.

It is found through research and analysis that the main reason of the problem is as follows: in order to meet the requirement that any two adjacent display driving pulses partially overlap with each other, during the period in which the first driving output circuit outputs the display driving pulse, other driving output circuits (for example, the second driving output circuit outputting the display driving pulse) start to output the display driving pulse (for example, the rising edge of the display driving pulse), and the voltage at the pull-up node is changed due to the bootstrap effect of the first capacitor. That is, the voltage at the pull-up node may jump during the period in which the first driving output circuit outputs the display driving pulse, which may cause the actual waveform of the display driving pulse output by the first driving output circuit to be different from the actual waveforms of the display driving pulses output by the other driving output circuits.

Similarly, during the period in which the last driving output circuit outputs the display driving pulse, other driving output circuits (for example, the second last driving output circuit outputting the display driving pulse) complete the outputting of the display driving pulse (for example, outputting the falling edge of the display driving pulse), and the voltage at the pull-up node is changed due to the bootstrap effect of the first capacitor; that is, the voltage at the pull-up node may jump during the period in which the last driving output circuit outputs the display driving pulse, which may cause the actual waveform of the display driving pulse output by the last driving output circuit to be different from the actual waveforms of the display driving pulses output by the other driving output circuits.

In order to effectively solve the technical problem in the related art that the actual waveform of the display driving pulse output by the first driving output circuit in the shift register circuit is different from the actual waveforms of the display driving pulses output by other driving output circuits and/or the actual waveform of the display driving pulse output by the last driving output circuit in the shift register circuit is different from the actual waveforms of the display driving pulses output by other driving output circuits, the present disclosure provides a new shift register unit.

Figure 5:
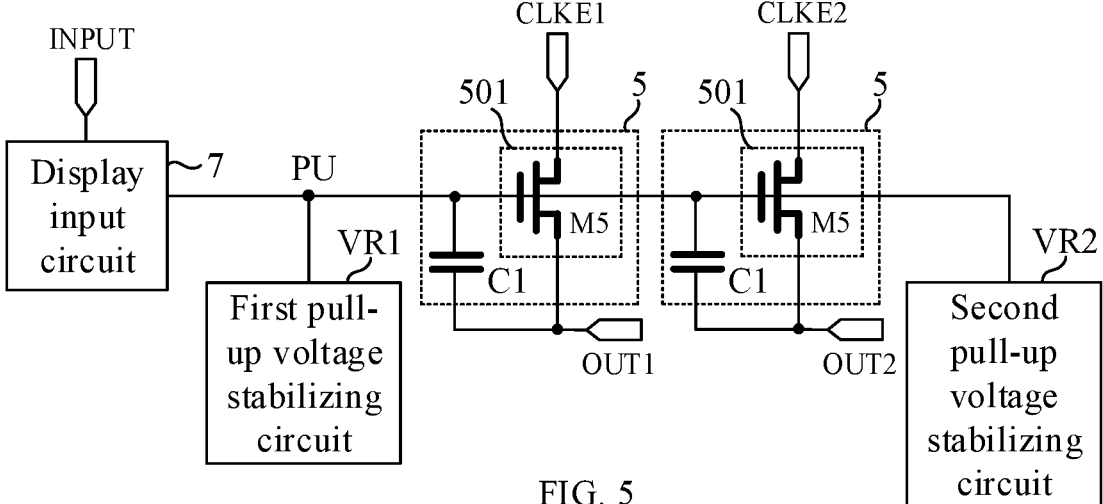
FIG. 5 is a schematic diagram of a circuit structure of a shift register unit according to embodiments of the present disclosure.

FIG. 5 is a schematic diagram of a circuit structure of a shift register unit according to embodiments of the present disclosure. As shown in FIG. 5, the shift register unit includes a shift register circuit including: a display input circuit 7 and at least two driving output circuits 5.

The display input circuit 7 is connected to a display signal input terminal INPUT and the pull-up node PU, and is configured to write an active level signal to the pull-up node PU in response to the active level signal provided by the display signal input terminal INPUT.

Each driving output circuit 5 is connected to the pull-up node PU, a corresponding one of driving clock signal input terminals CLKE1, CLKE2, and a corresponding one of driving signal output terminals OUT1, OUT2, and is configured to write a signal provided by the corresponding one of the driving clock signal input terminals CLKE1, CLKE2 to the corresponding one of the driving signal output terminals OUT1, OUT2 in response to an active level signal at the pull-up node PU.

In some embodiments, each driving output circuit 5 includes: a driving output sub-circuit 501 and a first capacitor C1. The driving output sub-circuit 501 is connected to the pull-up node PU, a corresponding one of the driving clock signal input terminals CLKE1, CLKE2 and a corresponding one of the driving signal output terminals OUT1, OUT2, and is configured to write the signal provided by the corresponding one of the driving clock signal input terminals CLKE1, CLKE2 to the corresponding one of the driving signal output terminals OUT1, OUT2 in response to the active level signal at the pull-up node PU. A first terminal of the first capacitor C1 is connected to the pull-up node PU, and a second terminal of the first capacitor C1 is connected to a corresponding one of the driving signal output terminals OUT1, OUT2.

It should be noted that the at least two driving output circuits 5 in the shift register circuit may sequentially output the display driving pulses, and any two adjacent display driving pulses partially overlap with each other, and the overlap ratio of any two adjacent display driving pulses may be designed in advance according to actual needs.

In the embodiments of the present disclosure, the shift register circuit further includes at least one of a first pull-up voltage stabilizing circuit VR1 and a second pull-up voltage stabilizing circuit VR2.

The first pull-up voltage stabilizing circuit VR1 is connected to the pull-up node PU, and is at least configured to maintain the voltage at the pull-up node PU unchanged during the period in which the first driving output circuit 5 outputs the display driving pulse.

The second pull-up voltage stabilizing circuit VR2 is connected to the pull-up node PU, and is at least configured to maintain the voltage at the pull-up node PU unchanged during the period in which the last driving output circuit 5 outputs the display driving pulse.

As an example, the shift register circuit includes the first pull-up voltage stabilizing circuit VR1. By providing the first pull-up voltage stabilizing circuit VR1, the voltage at the pull-up node PU is maintained unchanged during the period in which the first driving output circuit 5 outputs the display driving pulse, so that the technical problem in the related art due to the change in the voltage at the pull-up node PU can be solved that the actual waveform of the display driving pulse output by the first driving output circuit 5 is different from the actual waveforms of the display driving pulses output by the other driving output circuits 5.

Similarly, the shift register circuit includes the second pull-up voltage stabilizing circuit VR2, so that the technical problem in the related art due to the change in the voltage at the pull-up node PU can be solved that the actual waveform of the display driving pulse output by the last driving output circuit 5 is different from the actual waveforms of the display driving pulses output by the other driving output circuits 5.

In some embodiments, when the shift register circuit includes both the first pull-up voltage stabilizing circuit VR1 and the second pull-up voltage stabilizing circuit VR2, the first pull-up voltage stabilizing circuit VR1 and the second pull-up voltage stabilizing circuit VR2 are collectively configured to maintain the voltage at the pull-up node PU unchanged during the periods in which the driving output circuits 5 output the display driving pulses. That is, during the period from the start of outputting the display driving pulses by the first driving output circuits 5 to the end of outputting the display driving pulses by the last driving output circuits 5, the voltage at the pull-up node PU may be maintained unchanged by the first pull-up voltage stabilizing circuit VR1 and the second pull-up voltage stabilizing circuit VR2, so that it can be ensured that the actual waveforms of the display driving pulses output by the driving output circuits 5 are the same, and the problem of "horizontal stripes" caused by the difference among the waveforms of the display driving pulses can be effectively solved.

In some embodiments, each driving output sub-circuit 501 includes: a fifth transistor M5; a control electrode of the fifth transistor M5 is connected to the pull-up node PU, a first electrode of the fifth transistor M5 is connected to a corresponding one of the driving clock signal input terminals CLKE1, CLKE2, and a second electrode of the fifth transistor M5 is connected to a corresponding one of the driving signal output terminals OUT1, OUT2.

When the voltage at the pull-up node PU is at an active level, the fifth transistors M5 are turned on, and signals provided by the driving clock signal input terminals CLKE1 and CLKE2 are written to the corresponding driving signal output terminals OUT1 and OUT2, so that the driving signal output terminals OUT1 and OUT2 output the display driving pulses; when the voltage at the pull-up node PU is at a non-active level, the fifth transistors M5 are turned off.

Figure 6A:
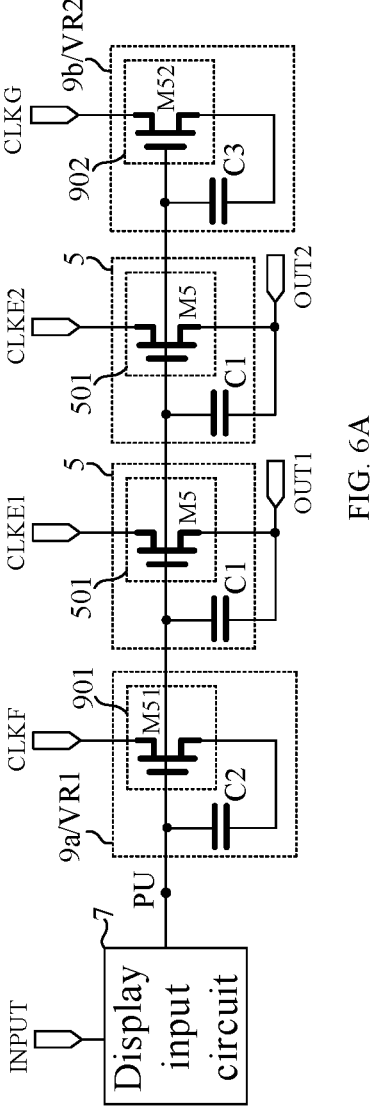
FIG. 6A is a schematic diagram of another circuit structure of a shift register unit according to embodiments of the present disclosure.
Figure 6B:
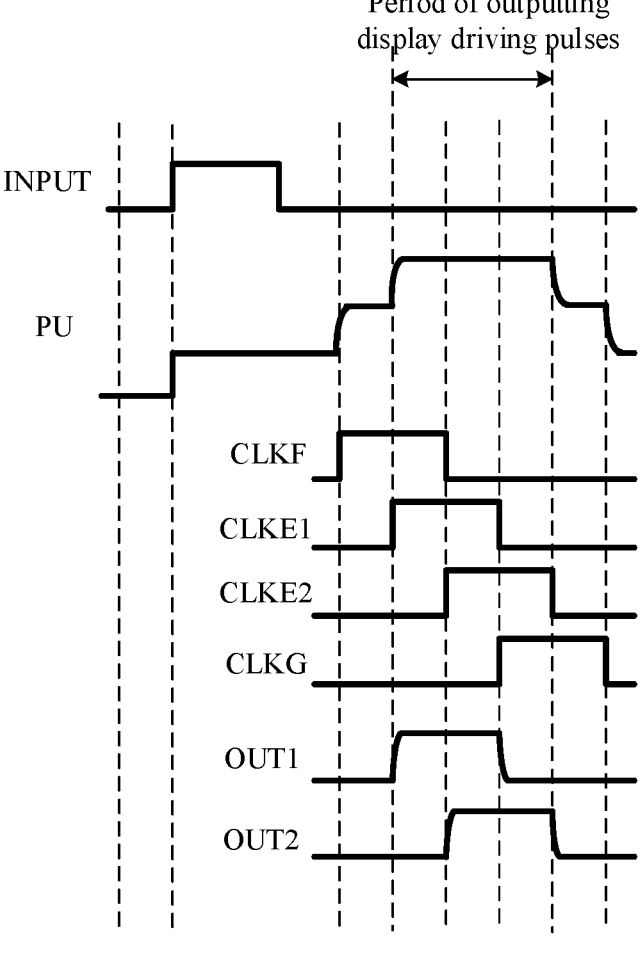
FIG. 6B is a timing diagram illustrating an operation of the shift register unit shown in FIG. 6A.

FIG. 6A is a schematic diagram of another circuit structure of a shift register unit according to embodiments of the present disclosure; FIG. 6B is a timing diagram illustrating an operation of the shift register unit shown in FIG. 6A. As shown in FIGS. 6A and 6B, FIGS. 6A and 6B show that the shift register circuit includes two driving output circuits 5.

In some embodiments, m other driving output circuits 5 sequentially start outputting the display driving pulses during the period in which the first driving output circuit 5 outputs the display driving pulse, m is a positive integer (FIGS. 6A and 6B exemplarily show m=1); the first pull-up voltage stabilizing circuit VR1 includes: m first voltage stabilizing sub-circuits 9a in one-to-one correspondence with the m other driving output circuits 5; each first voltage stabilizing sub-circuit 9a is connected to the pull-up node PU and a corresponding first voltage stabilizing clock signal input terminal, and is configured to maintain the voltage at the pull-up node PU unchanged according to a signal provided by the first voltage stabilizing clock signal input terminal and switching from a second level to a first level when the display driving pulse output by the driving output circuit 5 corresponding to the first voltage stabilizing sub-circuit 9a is switched from the first level to the second level.

In the embodiments of the present disclosure, one of the first level and the second level is a high level, and the other is a low level; in the following description, as an example, the first level of the pulse is a low level, and the second level is a high level.

In the related art, the m other driving output circuits 5 start outputting the display driving pulses during the period in which the first driving output circuit 5 outputs the display driving pulse. That is, the m other driving output circuits 5 output rising edges of the display driving pulses (switching from the first level to the second level), which may cause the voltage at the pull-up node PU to rise due to the bootstrap effect of the first capacitor C1.

In the present disclosure, in order to avoid that the voltage at the pull-up node PU is increased by the rising edges (of the display driving pulses) output from the m driving output circuits 5, the m first voltage stabilizing sub-circuits 9a in one-to-one correspondence with the m other driving output circuits 5 are disposed in the shift register circuit; each first voltage stabilizing sub-circuit 9a may cancel (i.e., offset), the pull-up action on the voltage at the pull-up node PU due to the rising edge output by a corresponding one of the m other driving output circuits 5, by a falling edge of a signal (a signal switching from the second level to the first level) provided by the first voltage stabilizing clock signal input terminal CLKF, so as to maintain the voltage at the pull-up node PU unchanged.

In some embodiments, each first voltage stabilizing sub-circuit 9a includes: a first transmission sub-circuit 901 and a second capacitor C2; the first transmission sub-circuit 901 is connected to the corresponding first voltage stabilizing clock signal input terminal CLKF, the pull-up node PU and a second terminal of the second capacitor C2, and is configured to write a signal provided by the first voltage stabilizing clock signal input terminal CLKF and switching from the second level to the first level to the second terminal of the second capacitor C2 in response to the active level signal at the pull-up node PU when the display driving pulse output by the corresponding driving output circuit 5 is switched from the first level to the second level; a first terminal of the second capacitor C2 is connected to the pull-up node PU.

When a rising edge is output by one of the m driving output circuits 5, which causes the corresponding first capacitor C1 to pull-up the voltage at the pull-up node PU the corresponding first transmission sub-circuit 901 may be controlled to output a falling edge to the second terminal of the second capacitor C2, so as to pull-down the voltage at the pull-up node PU due to the bootstrap effect of the second capacitor C2, thereby offsetting the pull-up action and maintaining the voltage at the pull-up node PU unchanged.

Therefore, the waveform provided by the first voltage stabilizing clock signal input terminal CLKF connected to each first voltage stabilizing sub-circuit 9a may be designed accordingly according to the rising edges output by the m driving output circuits 5, so as to ensure that the voltage at the pull-up node PU remains unchanged.

In some embodiments, the second capacitor C2 has the same capacitance as the first capacitor C1. At this time, a voltage variation of the falling edge output by the first voltage stabilizing sub-circuit 9a may be equal to that of the rising edge output by the driving output circuit 5. Therefore, the waveform of the pulse provided from the first voltage stabilizing clock signal input terminal CLKF to the first voltage stabilizing sub-circuit 9a may be the same as that of the pulse provided from each of the driving clock signal input terminals CLKE1, CLKE2 to the corresponding driving output circuit 5. That is, the first voltage stabilizing clock signal input terminal CLKF and the driving clock signal input terminals CLKE1, CLKE2 may be connected to the same set of clock supply signal lines, so that the number of signal lines required to be configured by the gate driving circuit can be reduced. The specific content will be described below.

In some embodiments, the first transmission sub-circuit 901 includes: a fifty-first transistor M51; a control electrode of the fifty-first transistor M51 is connected to the pull-up node PU, a first electrode of the fifty-first transistor M51 is connected to the corresponding first voltage stabilizing clock signal input terminal CLKF, and a second electrode of the fifty-first transistor M51 is connected to the second terminal of the second capacitor C2.

Referring to FIG. 6B, the voltage at the pull-up node PU remains unchanged during the period in which the first driving output circuit 5 outputs the display driving pulse.

In some embodiments, during the period in which the last driving output circuit 5 outputs the display driving pulse, n other driving output circuits 5 sequentially finish outputting the display driving pulses, n is a positive integer (FIGS. 6A and 6B exemplarily show n=1); the second pull-up voltage stabilizing circuit VR2 includes: n second voltage stabilizing sub-circuits 9b in one-to-one correspondence with the n other driving output circuits 5; each second voltage stabilizing sub-circuit 9b is connected to the pull-up node PU and a corresponding second voltage stabilizing clock signal input terminal CLKG, and is configured to maintain the voltage at the pull-up node PU unchanged according to a signal provided by the second voltage stabilizing clock signal input terminal CLKG and switching from a first level to a second level when the display driving pulse output by the driving output circuit 5 corresponding to the second voltage stabilizing sub-circuit 9b is switched from the second level to the first level.

In the related art, the n other driving output circuits 5 finish outputting the display driving pulses during the period in which the last driving output circuit 5 outputs the display driving pulse. That is, the n other driving output circuits 5 output falling edges of the display driving pulses (switching from the second level to the first level), which may cause the voltage at the pull-up node PU to fall due to the bootstrap effect of the first capacitor C1.

In the present disclosure, in order to avoid that the voltage at the pull-up node PU is decreased by the falling edges (of the display driving pulses) output by the n driving output circuits 5, the n second voltage stabilizing sub-circuits 9b in one-to-one correspondence with the n other driving output circuits 5 are disposed in the shift register circuit; each second voltage stabilizing sub-circuit 9b may cancel (i.e., offset), the pull-down action on the voltage at the pull-up node PU due to the falling edge output by a corresponding one of the n other driving output circuits 5, by a rising edge of a signal (a signal switching from the first level to the second level) provided by the second voltage stabilizing clock signal input terminal CLKG, so as to maintain the voltage at the pull-up node PU unchanged.

Therefore, the waveform provided by the second voltage stabilizing clock signal input terminal CLKG connected to each second voltage stabilizing sub-circuit 9b may be designed accordingly according to the falling edges output by the n driving output circuits 5, so as to ensure that the voltage at the pull-up node PU remains unchanged.

In some embodiments, each second voltage stabilizing sub-circuit 9b includes: a second transmission sub-circuit 902 and a third capacitor C3; the second transmission sub-circuit 902 is connected to the corresponding second voltage stabilizing clock signal input terminal CLKG, the pull-up node PU and a second terminal of the third capacitor C3, and is configured to write a signal provided by the second voltage stabilizing clock signal input terminal and switching from the first level to the second level to the second terminal of the third capacitor C3 in response to the active level signal at the pull-up node PU when the display driving pulse output by the corresponding driving output circuit 5 is switched from the second level to the first level; a first terminal of the third capacitor C3 is connected to the pull-up node PU.

When a falling edge is output by one of the n driving output circuits 5, which causes the corresponding first capacitor C1 to pull-down the voltage at the pull-up node PU, the corresponding second transmission sub-circuit 902 may be controlled to output a falling edge to the second terminal of the third capacitor C3, so as to pull-up the voltage at the pull-up node PU due to the bootstrap effect of the third capacitor C3, thereby offsetting the pull-down action and maintaining the voltage at the pull-up node PU unchanged.

In some embodiments, the third capacitor C3 has the same capacitance as the first capacitor C1. At this time, a voltage variation of the rising edge output by the second voltage stabilizing sub-circuit 9b may be equal to that of the falling edge output by the driving output circuit 5. Therefore, the waveform of the pulse provided from the second voltage stabilizing clock signal input terminal CLKG to the second voltage stabilizing sub-circuit 9b may be the same as that of the pulse provided from each of the driving clock signal input terminals CLKE1, CLKE2 to the corresponding driving output circuit 5. That is, the second voltage stabilizing clock signal input terminal CLKG and the driving clock signal input terminals CLKE1, CLKE2 may be connected to the same set of clock supply signal lines, so that the number of signal lines required to be configured by the gate driving circuit can be reduced. The specific content will be described below.

In some embodiments, the second transmission sub-circuit 902 includes: a fifty-second transistor M52; a control electrode of the fifty-second transistor M52 is connected to the pull-up node PU, a first electrode of the fifty-second transistor M52 is connected to the corresponding second voltage stabilizing clock signal input terminal CLKG, and a second electrode of the fifty-second transistor M52 is connected to the second terminal of the third capacitor C3.

Referring to FIG. 6B, the voltage at the pull-up node PU remains unchanged during the period in which the last driving output circuit 5 outputs the display driving pulse.

As shown in FIG. 6B, when the voltage at the pull-up node PU remains unchanged during the period in which the first driving output circuit 5 outputs the display driving pulse, and during the period in which the last driving output circuit 5 outputs the display driving pulse, the voltage at the pull-up node PU remains unchanged during a period in which each driving output circuit 5 outputs the display driving pulse. That is, the voltage at the pull-up node PU remains unchanged, and the driving output circuits 5 may sequentially output the display driving pulses having the same waveform during the period from the start of outputting the display driving pulse by the first driving output circuit 5 to the end of outputting the display driving pulse by the last driving output circuit 5.

Figure 7A:
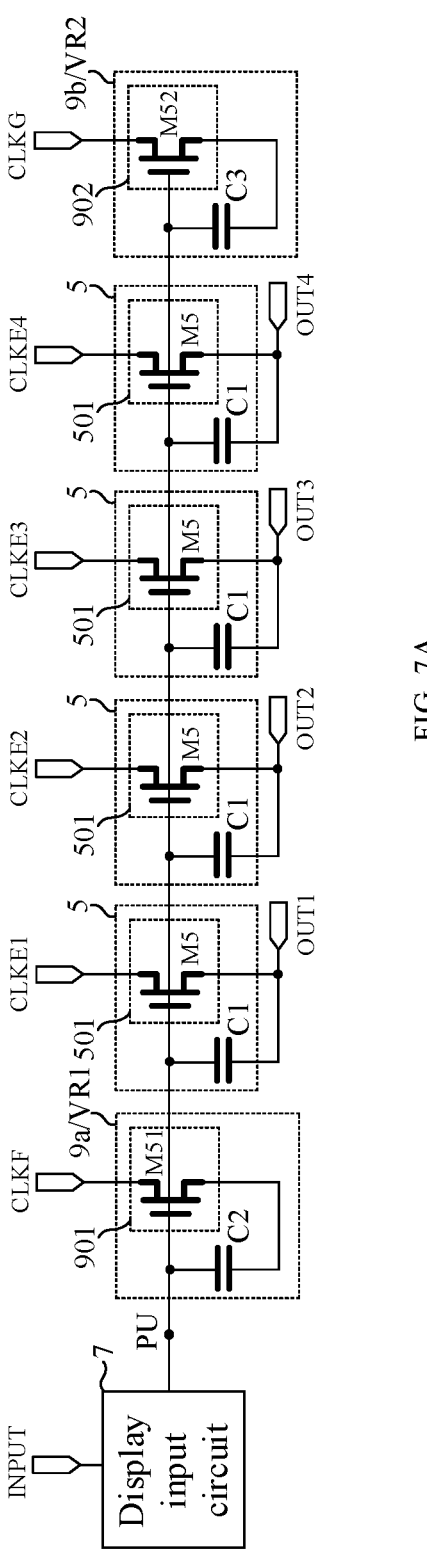
FIG. 7A is a schematic diagram of another circuit structure of a circuit structure of a shift register unit according to embodiments of the present disclosure.
Figure 7B:
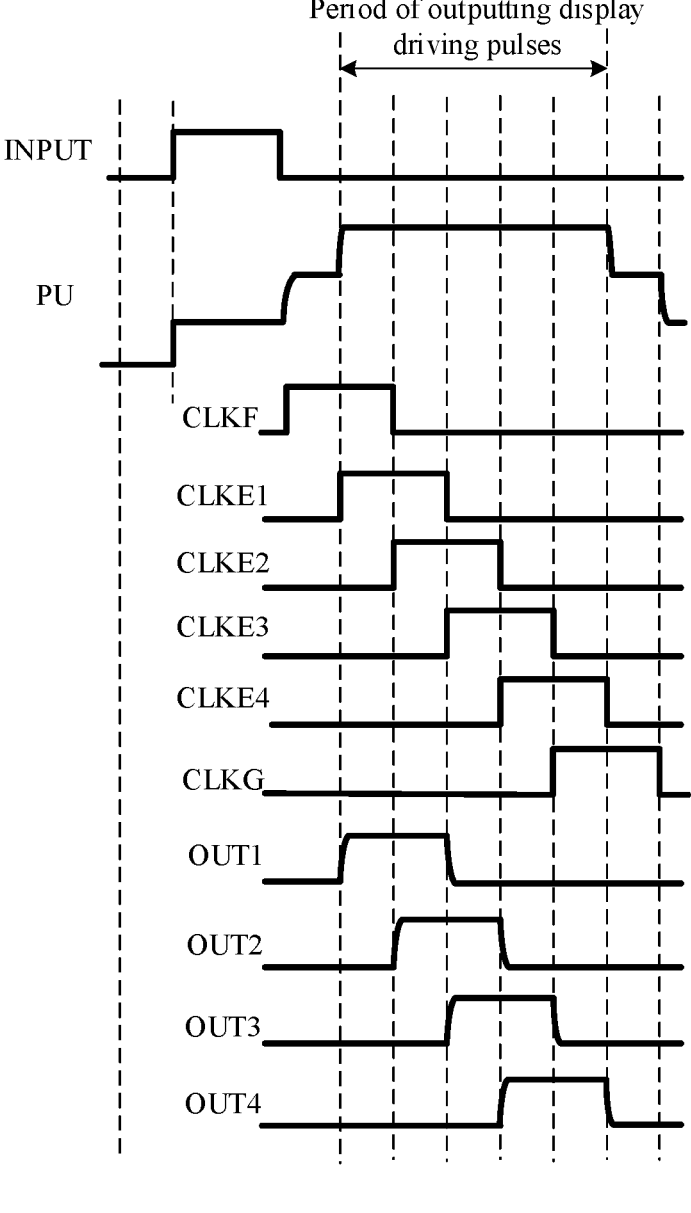
FIG. 7B is a timing diagram illustrating an operation of the shift register unit shown in FIG. 7A.

FIG. 7A is a schematic diagram of another circuit structure of a circuit structure of a shift register unit according to embodiments of the present disclosure; FIG. 7B is a timing diagram illustrating an operation of the shift register unit shown in FIG. 7A. As shown in FIGS. 7A and 7B, FIGS. 7A and 7B show that the shift register circuit includes four driving output circuits 5 and m=1 and n=1.

Figure 8A:
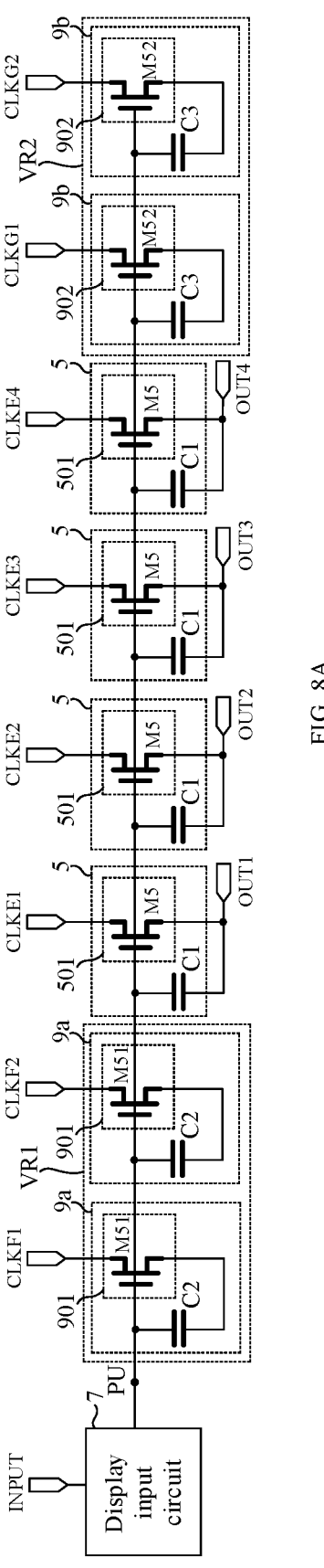
FIG. 8A is a schematic diagram of another circuit structure of a shift register unit according to embodiments of the present disclosure.
Figure 8B:
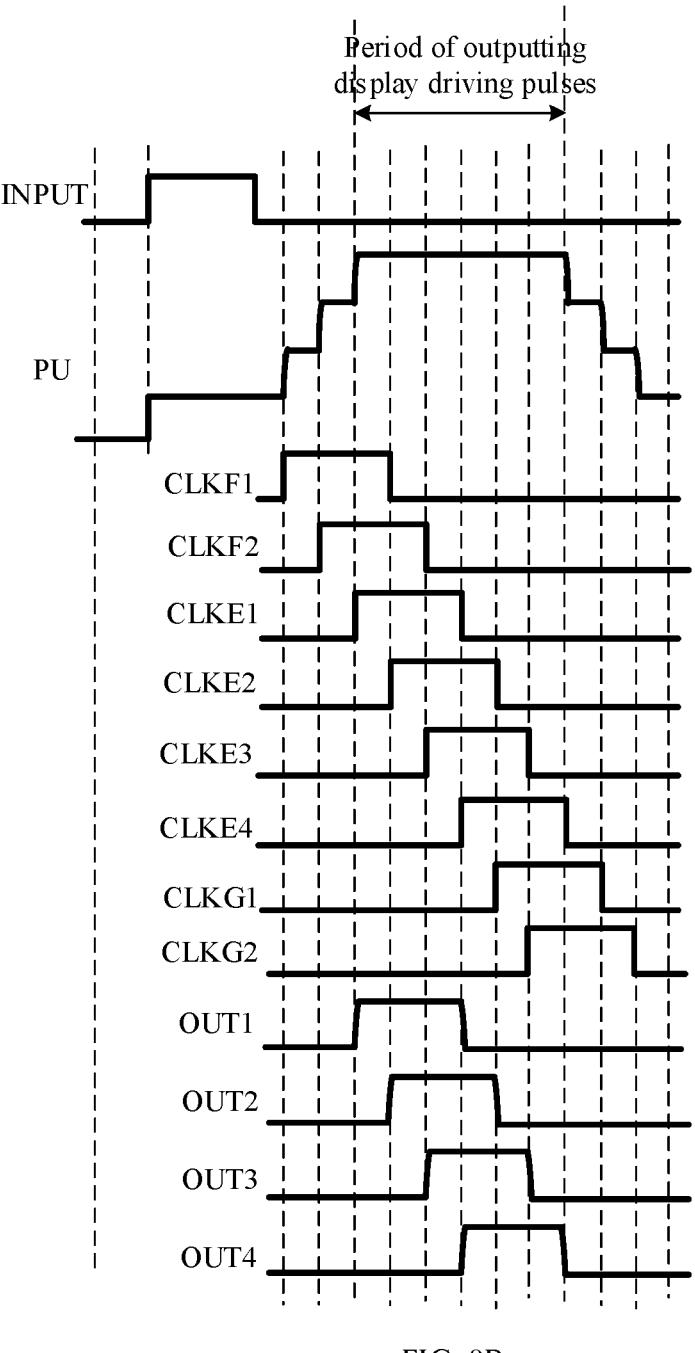
FIG. 8B is a timing diagram illustrating an operation of the shift register unit shown in FIG. 8A.

FIG. 8A is a schematic diagram of another circuit structure of a shift register unit according to embodiments of the present disclosure; FIG. 8B is a timing diagram illustrating an operation of the shift register unit shown in FIG. 8A. As shown in FIGS. 8A and 8B, FIGS. 8A and 8B show that the shift register circuit includes four driving output circuits 5 and m=2 and n=2. At this time, a overlap rate of any two adjacent display driving pulses is about 66.7%.

It should be noted that the number (greater than 1) of the driving output circuits 5 in the shift register circuit, the value of m, and the value of n are not limited in the technical solution of the present disclosure.

FIGS. 6A to 8A exemplarily show that the shift register circuit includes both the first voltage stabilizing sub-circuit 9a (the first pull-up voltage stabilizing circuit VR1) and the second voltage stabilizing sub-circuit 9b (the second pull-up voltage stabilizing circuit VR2), which is also a preferred implementation in the embodiments of the present disclosure.

Figure 9:
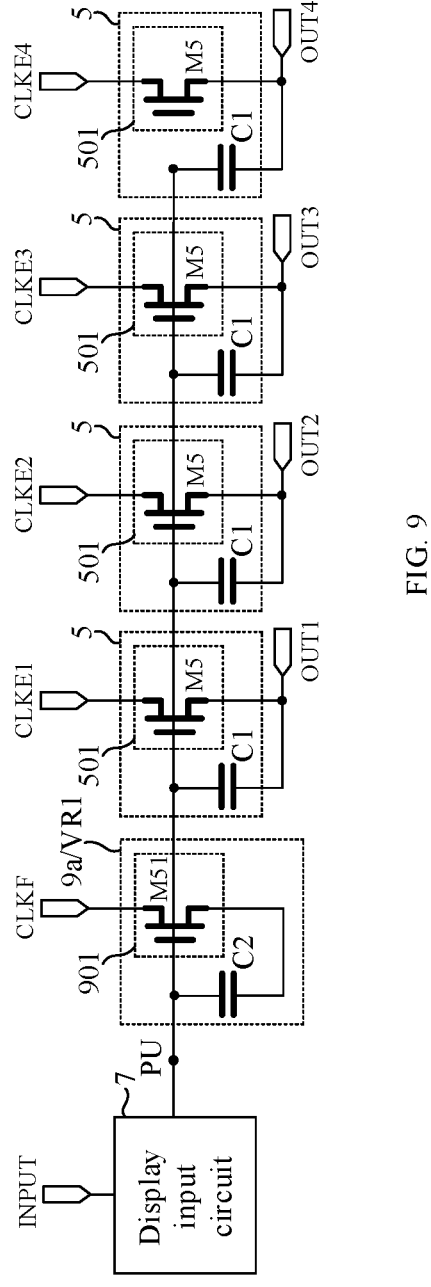
FIG. 9 is a schematic diagram of a circuit structure of a pull-up voltage stabilizing circuit in a shift register circuit with only a first voltage stabilizing sub-circuit according to embodiments of the present disclosure.

FIG. 9 is a schematic diagram of a circuit structure of a pull-up voltage stabilizing circuit in a shift register circuit with only a first voltage stabilizing sub-circuit according to embodiments of the present disclosure. As shown in FIG. 9, in some embodiments, the shift register circuit may also include only the first voltage stabilizing sub-circuit 9a (the first pull-up voltage stabilizing circuit VR1), and the shift register circuit can maintain the voltage at the pull-up node PU unchanged during the period in which the first driving output circuit 5 outputs the display driving pulse, so as to improve the "horizontal stripe" problem to some extent.

Figure 10:
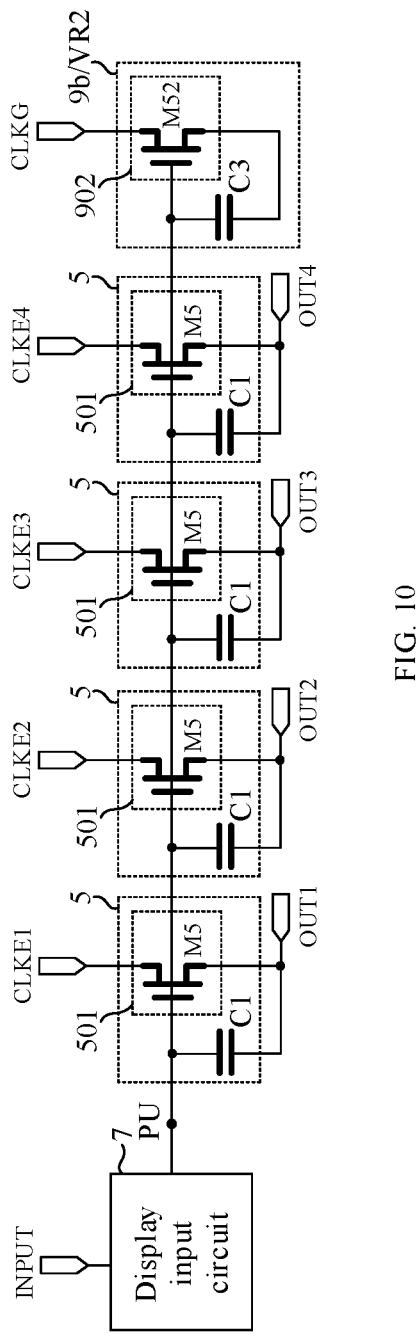
FIG. 10 is a schematic diagram of a circuit structure of a pull-up voltage stabilizing circuit in a shift register circuit with only a second voltage stabilizing sub-circuit according to embodiments of the present disclosure.

FIG. 10 is a schematic diagram of a circuit structure of a pull-up voltage stabilizing circuit in a shift register circuit with only a second voltage stabilizing sub-circuit according to embodiments of the present disclosure. As shown in FIG. 10, in some embodiments, the shift register circuit may also include only the second voltage stabilizing sub-circuit 9b (the second pull-up voltage stabilizing circuit VR2), and the shift register circuit can maintain the voltage at the pull-up node PU unchanged during the period in which the last driving output circuit 5 outputs the display driving pulse, which may improve the "horizontal stripe" problem to some extent.

In practical applications, the waveform of the falling edge of the display driving pulse is more important, so the shift register circuit in the present disclosure preferably includes at least the second pull-up voltage stabilizing circuit VR2.

In the following embodiments, as an example, the shift register circuit includes four driving output circuits 5, the first pull-up voltage stabilizing circuit (including one first voltage stabilizing sub-circuit 9a), and the second pull-up voltage stabilizing circuit (including one second voltage stabilizing sub-circuit 9b).

Figure 11:
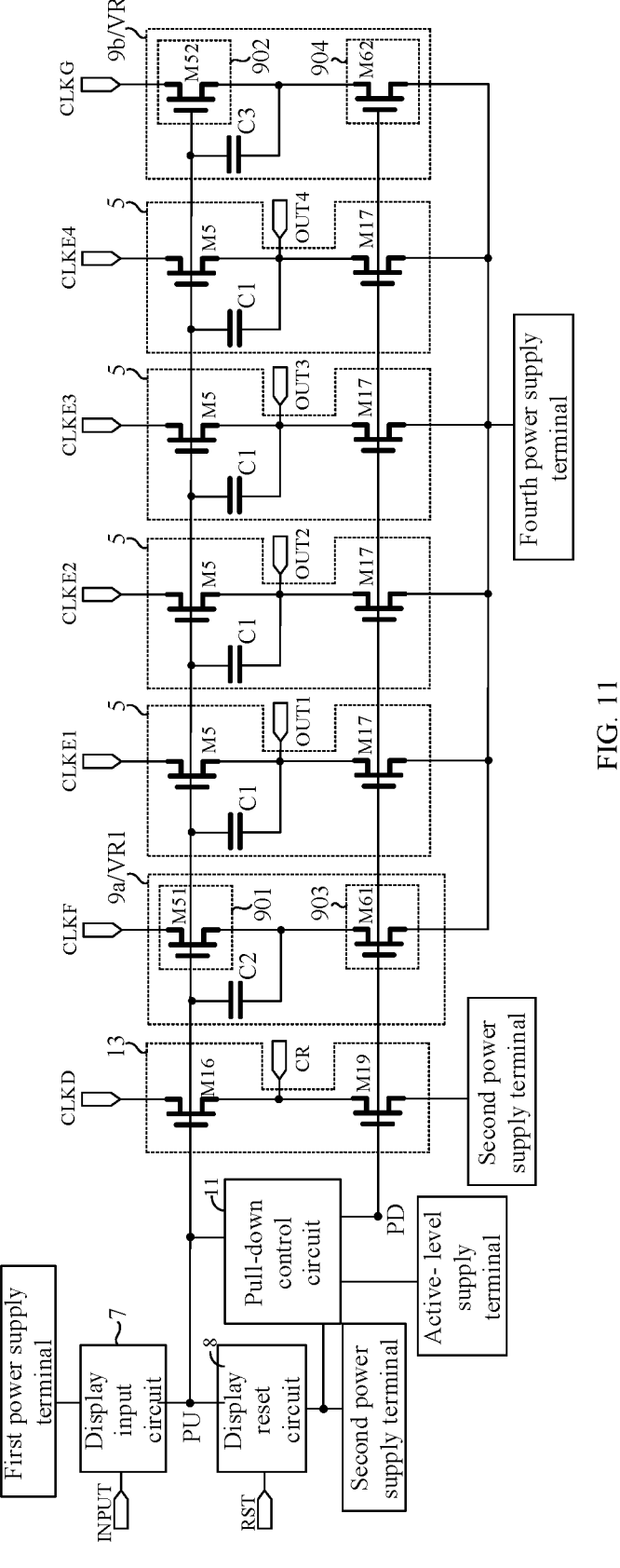
FIG. 11 is a schematic diagram of another circuit structure of a shift register unit according to embodiments of the present disclosure.

FIG. 11 is a schematic diagram of another circuit structure of a shift register unit according to embodiments of the present disclosure. As shown in FIG. 11, the shift register unit not only includes the display input circuit 7, the at least two driving output circuits 5, the first pull-up voltage stabilizing circuit VR1 and the second pull-up voltage stabilizing circuit VR2 in the previous embodiments, but also includes: a display reset circuit 8 and a pull-down control circuit 11.

The display reset circuit 8 is connected to a display reset signal input terminal RST, a second power supply terminal, and the pull-up node PU, and is configured to write a non-active level signal provided from the second power supply terminal to the pull-up node PU in response to an active level signal provided from the display reset signal input terminal. The display reset circuit 8 may reset the pull-up node PU in response to a signal provided from the display reset signal input terminal RST.

The pull-down control circuit 11 is connected to the second power supply terminal, an active level supply terminal, the pull-up node PU, and a pull-down node PD, and is configured to write, to the pull-down node PD, a voltage with a phase opposite to that of the voltage at the pull-up node PU.

Each driving output sub-circuit 501 is further connected to the pull-down node PD and a fourth power supply terminal, and is further configured to write a non-active level signal provided from the fourth power supply terminal to a corresponding one of the driving signal output terminals OUT1 to OUT4 in response to an active level signal at the pull-down node PD.

In some embodiments, the first voltage stabilizing sub-circuit 9a further includes: a first reset sub-circuit 903; the first reset sub-circuit 903 is connected to the pull-down node PD, the second terminal of the second capacitor C2, and the fourth power supply terminal, and is configured to write a non-active level signal provided from the fourth power supply terminal to the second terminal of the second capacitor C2 in response to an active level signal at the pull-down node PD. The first reset sub-circuit 903 may function to reset the second terminal of the second capacitor C2.

In some embodiments, the first reset sub-circuit 903 includes: a sixty-first transistor M61; a control electrode of the sixty-first transistor M61 is connected to the pull-down node PD, a first electrode of the sixty-first transistor M61 is connected to the second terminal of the second capacitor C2, and a second electrode of the sixty-first transistor M61 is connected to the fourth power supply terminal.

In some embodiments, the second voltage stabilizing sub-circuit 9b further includes: a second reset sub-circuit 904; the second reset sub-circuit 904 is connected to the pull-down node PD, the second terminal of the third capacitor C3, and the fourth power supply terminal, and is configured to write a non-active level signal provided from the fourth power supply terminal to the second terminal of the third capacitor C3 in response to an active level signal at the pull-down node PD.

In some embodiments, the second reset sub-circuit 904 includes: a sixty-second transistor M62; a control electrode of the sixty-second transistor M62 is connected to the pull-down node PD, a first electrode of the sixty-second transistor M62 is connected to the second terminal of the third capacitor C3, and a second electrode of the sixty-second transistor M62 is connected to the fourth power supply terminal.

In some embodiments, the shift register circuit further includes: a pull-up noise reduction circuit 12; the pull-up noise reduction circuit 12 is connected to the second power supply terminal, the pull-up node PU and the pull-down node PD, and is configured to write a non-active level signal provided by the second power supply terminal to the pull-up node PU in response to an active level signal at the pull-down node PD.

In some embodiments, the shift register further includes: at least one cascade output circuit 13; the cascade output circuit 13 is connected to the pull-up node PU, a corresponding cascade clock signal input terminal, and a corresponding cascade signal output terminal CR, and is configured to write a signal provided from the cascade clock signal input terminal to the cascade signal output terminal in response to the pull-up node PU.

Further alternatively, the at least one cascade output circuit 13 is further connected to the pull-down node PD and the second power supply terminal, and is further configured to write a non-active level signal provided from the second power supply terminal to the cascade signal output terminal CR in response to the voltage at the pull-down node PD.

Figure 12:
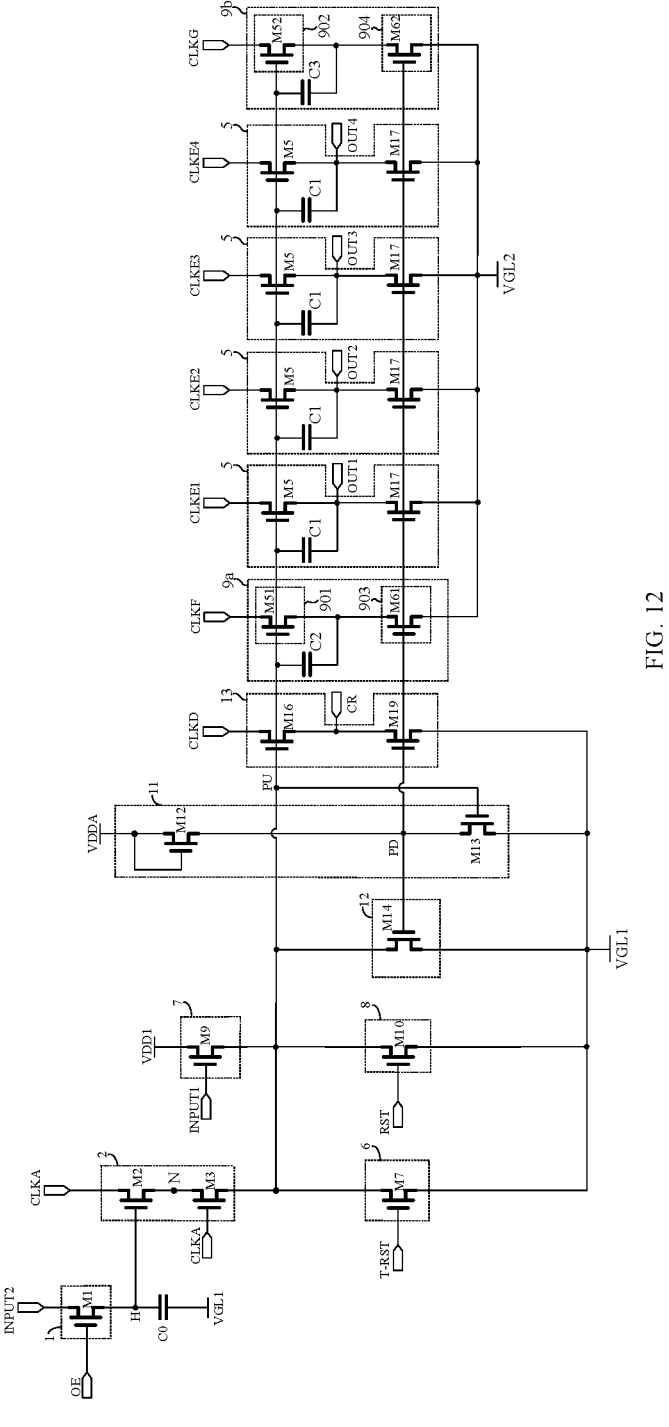
FIG. 12 is a schematic diagram of another circuit structure of a shift register unit according to embodiments of the present disclosure.

FIG. 12 is a schematic diagram of another circuit structure of a shift register unit according to embodiments of the present disclosure. As shown in FIG. 12, the shift register unit according to the embodiments of the present disclosure further has a function of outputting a driving pulse for sensing. In some embodiments, the shift register circuit further includes: a sensing control circuit 1 and a sensing input circuit 2.

The sensing control circuit 1 is connected to a sensing control node H, a sensing signal input terminal and a random signal input terminal OE, and is configured to write a signal provided from the sensing signal input terminal INPUT2 to the sensing control node H in response to an active level signal provided from the random signal input terminal OE.

The sensing input circuit 2 is connected to the sensing control node H, the clock control signal input terminal CLKA, a sensing intermediate node N and the pull-up node PU, and is configured to write an active level signal to the sensing intermediate node N in response to an active level signal at the sensing control node H, and to electrically connect the sensing intermediate node N and the pull-up node PU in response to an active level signal provided by the clock control signal input terminal CLKA.

In some embodiments, the shift register circuit further includes: a global reset circuit 6; the global reset circuit 6 is connected to a global reset signal input terminal T-RST, the second power supply terminal and the pull-up node PU, and is configured to write a non-active level signal provided by the second power supply terminal to the pull-up node PU in response to an active level signal provided by the global reset signal input terminal T-RST.

In some embodiments, the sensing control circuit 1 includes a first transistor M1 and a holding capacitor C0.

A control electrode of the first transistor M1 is connected to the random signal input terminal OE, a first electrode of the first transistor M1 is connected to the sensing signal input terminal INPUT2, and a second electrode of the first transistor M1 is connected to the sensing control node H.

A first terminal of the holding capacitor C0 is connected to the sensing control node H, and a second terminal of the holding capacitor is connected to a constant voltage supply terminal, such as the ground or a power supply terminal. FIG. 12 illustrates that the second terminal of the holding capacitor C0 is connected to the second power supply terminal.

In some embodiments, the sensing input circuit 2 includes a second transistor M2 and a third transistor M3.

A control electrode of the second transistor M2 is connected to the sensing control node H, a first electrode of the second transistor M2 is connected to the clock control signal input terminal CLKA (shown in FIG. 12) or a first power supply terminal (which is not shown in figures), and a second electrode of the second transistor M2 is connected to the sensing intermediate node N.

A control electrode of the third transistor M3 is connected to the clock control signal input terminal CLKA, a first electrode of the third transistor M3 is connected to the sensing intermediate node N, and a second electrode of the third transistor M3 is connected to the pull-up node PU.

In some embodiments, the global reset circuit 6 includes: a seventh transistor M7; a control electrode of the seventh transistor M7 is connected to the global reset signal input terminal T-RST, a first electrode of the seventh transistor M7 is connected to the pull-up node PU, and a second electrode of the seventh transistor M7 is connected to the second power supply terminal.

In some embodiments, the display input circuit 7 includes: a ninth transistor M9; a control electrode of the ninth transistor M9 is connected to the display signal input terminal INPUT1, a first electrode of the ninth transistor M9 is connected to the first power supply terminal (shown in FIG. 12) or the display signal input terminal INPUT1 (which is not shown in figures), and a second electrode of the ninth transistor M9 is connected to the pull-up node PU.

In some embodiments, the display reset circuit 8 includes: a tenth transistor M10; a control electrode of the tenth transistor M10 is connected to the display reset signal input terminal RST, a first electrode of the tenth transistor M10 is connected to the pull-up node PU, and a second electrode of the tenth transistor M10 is connected to the second power supply terminal.

In some embodiments, the pull-down control circuit 11 includes: a twelfth transistor M12 and a thirteenth transistor M13.

A control electrode of the twelfth transistor M12 is connected to the active level supply terminal, a first electrode of the twelfth transistor M12 is connected to the control electrode of the twelfth transistor M12, and a second electrode of the twelfth transistor M12 is connected to the pull-down node PD.

A control electrode of the thirteenth transistor M13 is connected to the pull-up node PU, a first electrode of the thirteenth transistor M13 is connected to the pull-down node PD, and a second electrode of the thirteenth transistor M13 is connected to the second power supply terminal.

In some embodiments, the pull-up noise reduction circuit 12 includes: a fourteenth transistor M14; a control electrode of the fourteenth transistor M14 is connected to the pull-down node PD, a first electrode of the fourteenth transistor M14 is connected to the pull-up node PU, and a second electrode of the fourteenth transistor M14 is connected to the second power supply terminal.

In some embodiments, each driving output sub-circuit 501 includes: a fifth transistor M5 and a seventeenth transistor M17.

A control electrode of the fifth transistor M5 is connected to the pull-up node PU, a first electrode of the fifth transistor M5 is connected to a corresponding one of the driving clock signal input terminals CLKE1 to CLKE4, and a second electrode of the fifth transistor M5 is connected to a corresponding one of the driving signal output terminals OUT1 to OUT4.

A control electrode of the seventeenth transistor M17 is connected to the pull-down node PD, a first electrode of the seventeenth transistor M17 is connected to a corresponding one of the driving signal output terminals OUT1 to OUT4, and a second electrode of the seventeenth transistor M17 is connected to the fourth power supply terminal.

In some embodiments, the cascade output circuit 13 includes: a sixteenth transistor M16 and a nineteenth transistor M19.

A control electrode of the sixteenth transistor M16 is connected to the pull-up node PU, a first electrode of the sixteenth transistor M16 is connected to the corresponding cascade clock signal input terminal CLKD, and a second electrode of the sixteenth transistor M16 is connected to the corresponding cascade signal output terminal CR.

A control electrode of the nineteenth transistor M19 is connected to the pull-down node PD, a first electrode of the nineteenth transistor M19 is connected to the corresponding cascade signal output terminal CR, and a second electrode of the nineteenth transistor M19 is connected to the second power supply terminal.

In some embodiments, the first power supply terminal provides a high level voltage VDD1, the second power supply terminal provides a low level voltage VGL1, the fourth power supply terminal provides a low level voltage VGL2, and the active level supply terminal provides a high level voltage VDDA.

Figure 13:
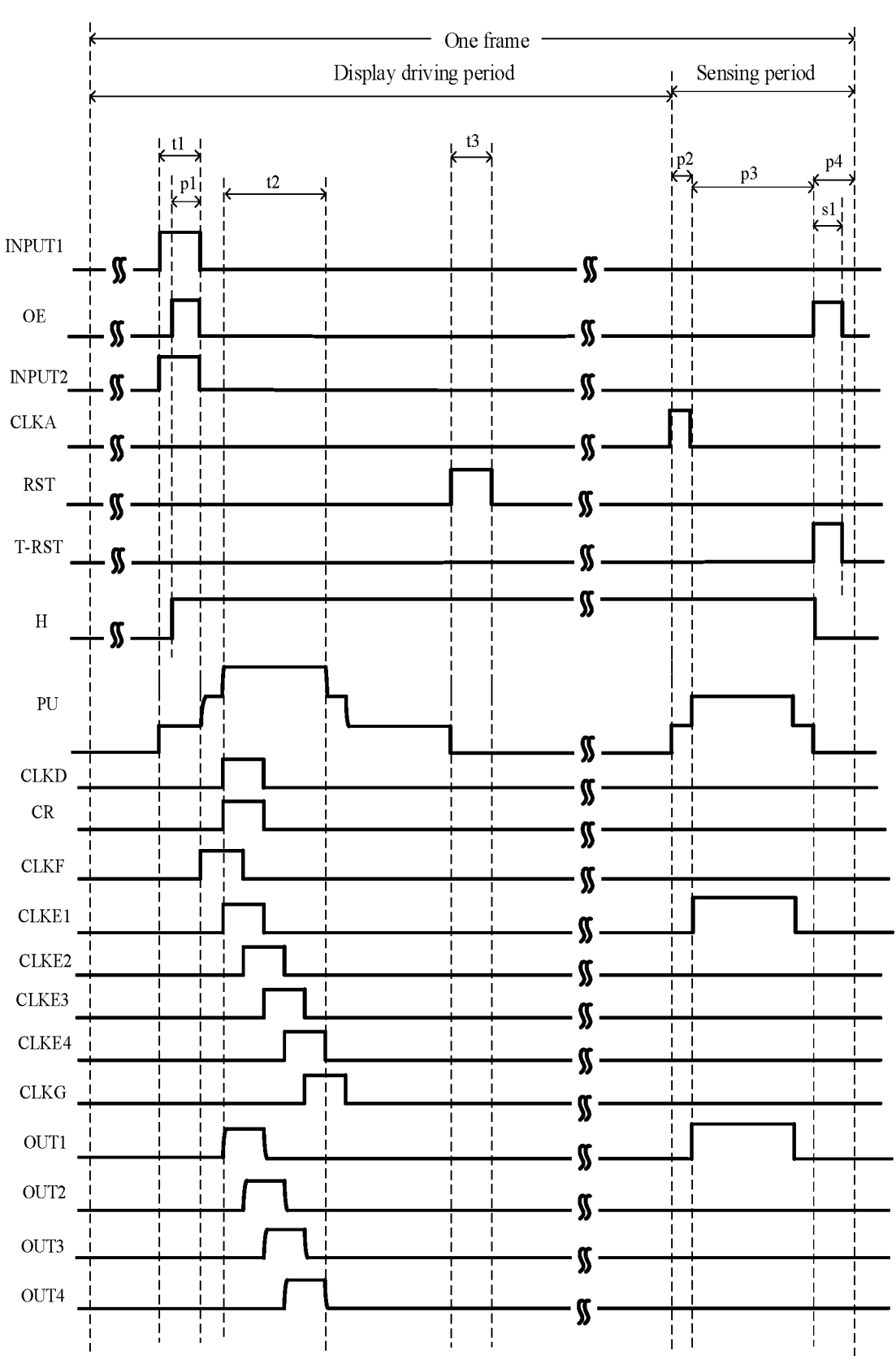
FIG. 13 is a timing diagram illustrating an operation of the shift register unit shown in FIG. 12.

FIG. 13 is a timing diagram illustrating an operation of the shift register unit shown in FIG. 12. As shown in FIG. 13, an operation process of the shift register unit includes: a display driving process, a sensing driving process, and a global reset process s1.

The display driving process includes: a display input phase t1, a display output phase t2 and a display reset phase t3; the sensing driving process includes: a sensing preparation phase p1, a sensing input phase p2, a sensing output phase p3, and a sensing control reset phase p4.

In the display input phase t1, the display signal input terminal INPUT1 provides a high level signal, so that the ninth transistor M9 is turned on, the high level voltage VDD1 provided by the first power supply terminal is written to the pull-up node PU through the ninth transistor M9, the pull-up node PU is at a high level, and accordingly, each fifth transistor and the sixteenth transistor M16 are turned on.

When the pull-up node PU is at a high level, the thirteenth transistor M13 is turned on, the low level voltage VGL1 provided by the second power supply terminal is written to the pull-down node PD through the thirteenth transistor M13, the pull-down node PD is at a low level, and each seventeenth transistor M17 and the nineteenth transistor M19 are turned off.

At this time, the driving clock signal input terminals CLKE1 to CLKE4 write low level signals to the corresponding driving signal output terminals OUT1 to OUT4 through the corresponding fifth transistors M5; the cascade clock signal input terminal CLKD writes a low level signal to the cascade signal output terminal CR through the sixteenth transistor M16. That is, the driving signal output terminals OUT1 to OUT4 and the cascade signal output terminal CR output low level signals.

It should be noted that after the display input phase t1 is started, both the fifty-first transistor M51 and the fifty-second transistor M52 are in an ON state. A rising edge of a signal provided by the first voltage stabilizing clock signal input terminal CLKF pulls up the voltage at the pull-up node PU before entering the display output phase t2.

In the display output phase t2, the display signal input terminal INPUT1 provides a low level signal, so that the ninth transistor M9 is turned off, and the pull-up node PU is in a floating state and maintains a high level in the previous phase; each fifth transistor M5, the fifty-first transistor M51, and the sixteenth transistor M16 are maintained to be turned on.

The driving clock signal input terminals CLKE1 to CLKE4 sequentially provide display driving pulses to the corresponding fifth transistors M5, and the driving signal output terminals OUT1 to OUT4 sequentially output the display driving pulses.

At a rising edge of the display driving pulse output by the first driving signal output terminal OUT1, the first capacitor C1 connected to the first driving signal output terminal OUT1 pulls up the voltage at the pull-up node PU once.

At a rising edge of the display driving pulse output by the second driving signal output terminal OUT2, the first capacitor C1 connected to the second driving signal output terminal OUT2 pulls up the voltage at the pull-up node PU; meanwhile, the fifty-first transistor M51 outputs a falling edge of a pulse to the second terminal of the second capacitor C2 the second capacitor C2 pulls down the voltage at the pull-up node PU, which cancels the pull-up action of the first capacitor C1 on the pull-up node PU, so that the voltage at the pull-up node PU remains unchanged.

At a falling edge of the display driving pulse output by the first driving signal output terminal OUT1, the first capacitor C1 connected to the first driving signal output terminal OUT1 pulls down the voltage at the pull-up node PU; meanwhile, at a rising edge of the display driving pulse output by the third driving signal output terminal OUT3, the first capacitor C1 connected to the third driving signal output terminal OUT3 pulls up the voltage at the pull-up node PU, the pull-down action and the pull-up action of the two first capacitors C1 on the pull-up node PU are cancelled out, and thus, the voltage at the pull-up node PU remains unchanged.

At a falling edge of the display driving pulse output by the second driving signal output terminal OUT2, the first capacitor C1 connected to the second driving signal output terminal OUT2 pulls down the voltage at the pull-up node PU; meanwhile, at a rising edge of the display driving pulse output by the fourth driving signal output terminal OUT4, the first capacitor C1 connected to the fourth driving signal output terminal OUT4 pulls up the voltage at the pull-up node PU, the pull-down action and the pull-up action of the two first capacitors C1 on the pull-up node PU are cancelled out, and thus, the voltage at the pull-up node PU remains unchanged.

At a falling edge of the display driving pulse output by the third driving signal output terminal OUT3, the first capacitor C1 connected to the third driving signal output terminal OUT3 pulls down the voltage at the pull-up node PU; meanwhile, the fifty-second transistor M52 outputs a rising edge to the second terminal of the third capacitor C3, the third capacitor C3 pulls up the voltage at the pull-up node PU, which cancels the pull-down action of the first capacitor C1 on the pull-up node PU, so that the voltage at the pull-up node PU remains unchanged.

At a falling edge of the fourth driving signal output terminal OUT4, the first capacitor C1 connected to the fourth driving signal output terminal OUT4 pulls down the voltage at the pull-up node PU.

Therefore, the first pull-up voltage stabilizing circuit VR1 and the second pull-up voltage stabilizing circuit VR2 may maintain the voltage at the pull-up node PU unchanged during the period from the start of outputting the display driving pulse by the first driving output circuit 5 to the end of outputting the display driving pulse by the last driving output circuit 5.

It should be noted that in the display output phase t2, a cascade pulse provided by the cascade clock signal input terminal CLKD is also written to the cascade signal output terminal CR through the sixteenth transistor M16, and the cascade signal output terminal CR outputs the cascade pulse. A timing of outputting the cascade pulse by the cascade signal output terminal CR may be designed in advance according to actual needs, which is not limited by the present disclosure.

After the display output phase t2 is ended, the falling edge of the signal provided by the second voltage stabilizing clock signal input terminal CLKG pulls down the voltage at the pull-up node PU.

In the display reset phase t3, the display reset signal input terminal RST provides a high level signal, so that the tenth transistor M10 is turned on, the low level signal provided by the second power supply terminal is written to the pull-up node PU through the tenth transistor M10, the pull-up node PU is at a low level, and both the fifth transistors M5 and the sixteenth transistor M16 are turned off.

At this time, the thirteenth transistor M13 is also turned off, the high level voltage VDDA provided from the active level supply terminal is written to the pull-down node PD through the twelfth transistor M12, the first pull-down node PD is at a high level, and the seventeenth transistors and the nineteenth transistor are both turned off.

At this time, the low level voltage VGL2 provided from the fourth power supply terminal is written to the driving signal output terminals OUT through the corresponding seventeenth transistors; the low level voltage VGL2 provided by the fourth power supply terminal is written to the second terminal of the second capacitor C2 through the sixty-first transistor; the low level voltage VGL2 provided by the fourth power supply terminal is written to the second terminal of the third capacitor C3 through the sixty-second transistor; the low level voltage VGL1 provided from the second power supply terminal is written to the cascade signal output terminal CR through the nineteenth transistor. That is, the driving signal output terminals OUT and the cascade signal output terminal CR output a low level signal.

In addition, since the pull-down node PD is at a high level, the fourteenth transistor M14 is also turned on, and the low level voltage VGL1 provided by the second power supply terminal is written to the pull-up node PU through the fourteenth transistor M14, so as to reduce the noise of the pull-up node PU. At this time, voltages across the second capacitor C2 and the third capacitor C3 are at a low level.

In the sensing preparation phase p1, the sensing signal input terminal INPUT2 and the random signal input terminal OE both provide a high level signal, and the first transistor M1 is turned on; since the sensing signal input terminal also provides the high level signal, the high level signal provided by the sensing signal input terminal is written to the sensing control node H through the first transistor M1 to charge the sensing control node H, and a voltage at the sensing control node H is at a high level. Accordingly, the second transistor M2 is turned on; however, since the clock control signal input terminal CLKA provides a low level signal, the third transistor M3 is turned off.

In the sensing input phase p2, the clock control signal input terminal CLKA provides a high level signal, so the third transistor M3 is turned on. At this time, since the second transistor M2 remains turned on due to the voltage at the sensing control node H at a high level, the high level signal provided by the clock control signal input terminal CLKA may be written to the pull-up node PU through the second transistor M2 and the third transistor M3. That is, the voltage at the pull-up node PU at a high level. Accordingly, the transistors whose control electrodes are connected to the pull-up node PU are all turned on.

When the pull-up node PU at a high level, the thirteenth transistor M13 is turned on, the low level voltage VGL1 provided by the second power supply terminal is written to the pull-down node PD through the thirteenth transistor M13, the pull-down node PD is at a low level, and each transistor whose control electrode is connected to the pull-down node PD is turned off.

At this time, the driving clock signal input terminals CLKE1 to CLKE4 write low level signals to the driving signal output terminals OUT1 to OUT4 through the corresponding fifth transistors M5; the cascade clock signal input terminal CLKD writes a low level signal to the cascade signal output terminal CR through the sixteenth transistor M16. That is, the driving signal output terminals OUT1 to OUT4 and the cascade signal output terminal CR output a low level signal.

In the sensing output phase p3, the clock control signal input terminal CLKA provides a low level signal, so the third transistor M3 is turned off. The pull-up node PU is in a floating state and maintains the high level in the previous phase; the fifth transistors M5 and the sixteenth transistor M16 are all still turned on.

At the initial time of the sensing output phase p3, a signal provided by one driving clock signal input terminal (selected according to the sensing driving requirement) changes from a low level signal to a high level signal, the voltage at the pull-up node PU is pulled up to a higher level due to the bootstrap effect of the first capacitor C1, and the driving signal output terminal corresponding to the driving clock signal input terminal outputs a high level signal, that is, outputs the sensing driving pulse. After a period of time has elapsed since the sensing output phase p3, the signal provided by the above driving clock signal input terminal changes from a high level signal to a low level signal, and the voltage at the pull-up node PU is pulled down to the original high level voltage due to the bootstrap effect of the first capacitor C1, the fifth transistors M5 remain turned on, and the driving signal output terminals output the low level signals.

It should be noted that the cascade clock signal input terminal CLKD provides a low level signal throughout the sensing output phase p3, so the cascade signal output terminal CR outputs a low level signal throughout the sensing output phase p3.

In the sensing control reset phase p4, the random signal input terminal OE provides a high level signal, so that the first transistor M1 is turned on. A low level signal provided from the sensing signal input terminal is written to the sensing control node H through the first transistor M1 to reset the sensing control node H.

In the global reset phase s1, the global reset signal input terminal T-RST provides a high level signal, so that the seventh transistor M7 is turned on, and the low level voltage VGL1 provided by the second power supply terminal is written to the pull-up node PU through the seventh transistor M7 to reset the pull-up node PU.

When the pull-up node PU at a high level, the high level voltage VDDA provided by the active level supply terminal is written to the pull-down node PD through the twelfth transistor M12, the first pull-down node PD is at a high level, and the seventeenth transistors M17 and the nineteenth transistor M19 are both in an ON state.

In the embodiments of the present disclosure, the order of the sensing control reset phase p4 and the global reset phase s1 is not limited in the present disclosure. For example, the sensing control reset phase p4 may be located before the global reset phase s1 (not shown), may be synchronized with the global reset phase s1 (shown in FIG. 13), or may be located after the global reset phase s1 (not shown). In the embodiments of the present disclosure, it is only necessary to ensure that the sensing control reset phase p4 is located after the sensing input phase p2 and the global reset phase s1 is located after the sensing output phase p3.

Figure 14:
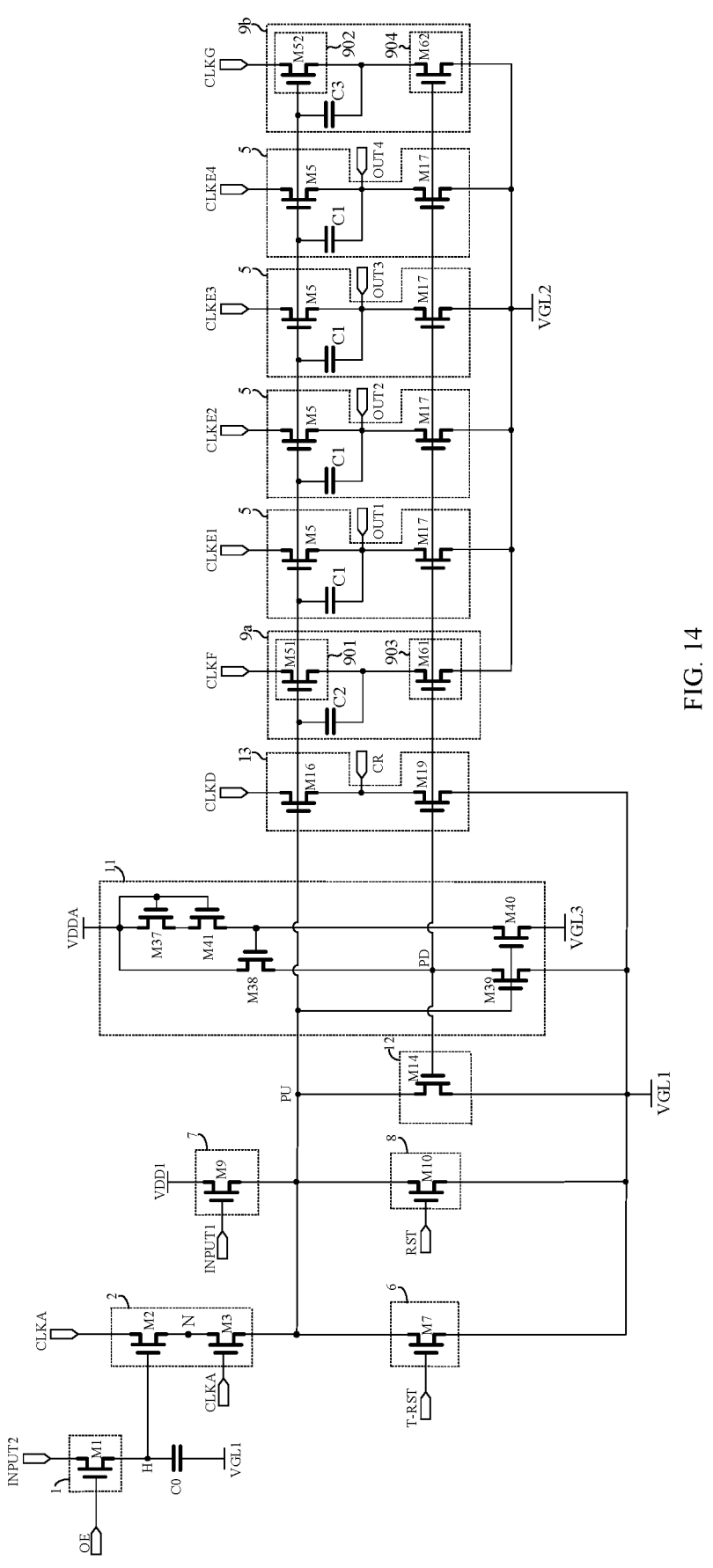
FIG. 14 is a schematic diagram of another circuit structure of a shift register unit according to embodiments of the present disclosure.

FIG. 14 is a schematic diagram of another circuit structure of a shift register unit according to embodiments of the present disclosure. As shown in FIG. 14, unlike the shift register unit shown in FIG. 12, the pull-down control circuit 11 in the shift register unit shown in FIG. 14 includes: a thirty-seventh transistor M37, a thirty-eighth transistor M38, a thirty-ninth transistor M39, and a fortieth transistor M40.

A control electrode of the thirty-seventh transistor M37 is connected to the active level supply terminal, a first electrode of the thirty-seventh transistor M37 is connected to the control electrode of the thirty-seventh transistor M37, and a second electrode of the thirty-seventh transistor M37 is connected to a control electrode of the thirty-eighth transistor M38.

The control electrode of the thirty-eighth transistor M38 is connected to a first electrode of the fortieth transistor M40, a first electrode of the thirty-eighth transistor M38 is connected to the active level supply terminal, and a second electrode of the thirty-eighth transistor M38 is connected to the pull-down node PD.

A control electrode of the thirty-ninth transistor M39 is connected to the pull-up node PU, a first electrode of the thirty-ninth transistor M39 is connected to the pull-down node PD, and a second electrode of the thirty-ninth transistor M39 is connected to a fifth power supply terminal.

In some embodiments, the fifth power supply terminal provides a low level voltage VGL3, wherein the voltage VGL3 is slightly less than the low level voltage VGL1 provided by the second power supply terminal. For example, 0V<VGL1−VGL3<0.2V. By such a design, when both the thirty-ninth transistor M39 and the fortieth transistor M40 are in an ON state, a gate-source voltage at the thirty-eighth transistor M38 still remains less than 0, so as to ensure that the thirty-eighth transistor M38 is in an OFF state.

A control electrode of the fortieth transistor M40 is connected to the pull-up node PU, and a second electrode of the fortieth transistor M40 is connected to the second power supply terminal.

The thirty-seventh transistor M37 to the fortieth transistor M40 may also be used to invert the voltage at the pull-up node PU and provide the inverted voltage to the pull-down node PD.

Further optionally, the pull-down control circuit 11 further includes: a forty-first transistor M41; the thirty-seventh transistor M37 is connected to the control electrode of the thirty-eighth transistor M38 through the forty-first transistor M41; a control electrode of the forty-first transistor M41 is connected to the control electrode of the thirty-seventh transistor M37, a first electrode of the forty-first transistor M41 is connected to the second electrode of the thirty-seventh transistor M37, and a second electrode of the forty-first transistor M41 is connected to the control electrode of the thirty-eighth transistor M38.

It is found in practical applications that when the fortieth transistor M40 is in an OFF state and the thirty-seventh transistor M37 is in an ON state, a charging current (for charging the control electrode of the thirty-eighth transistor M38) with a short duration and a large current value exists between the control electrode of the thirty-eighth transistor M38 and the active level supply terminal, and easily damages (for example, breaks down) the thirty-seventh transistor M37.

In order to improve the above problem, in the embodiments of the present disclosure, the forty-first transistor M41 is disposed between the second electrode of the thirty-seventh transistor M37 and the control electrode of the thirty-eighth transistor M38, so that the charging current between the control electrode of the thirty-eighth transistor M38 and the active level supply terminal can be effectively reduced, so as to prevent the charging current from breaking down the thirty-seventh transistor M37.

Figure 15:
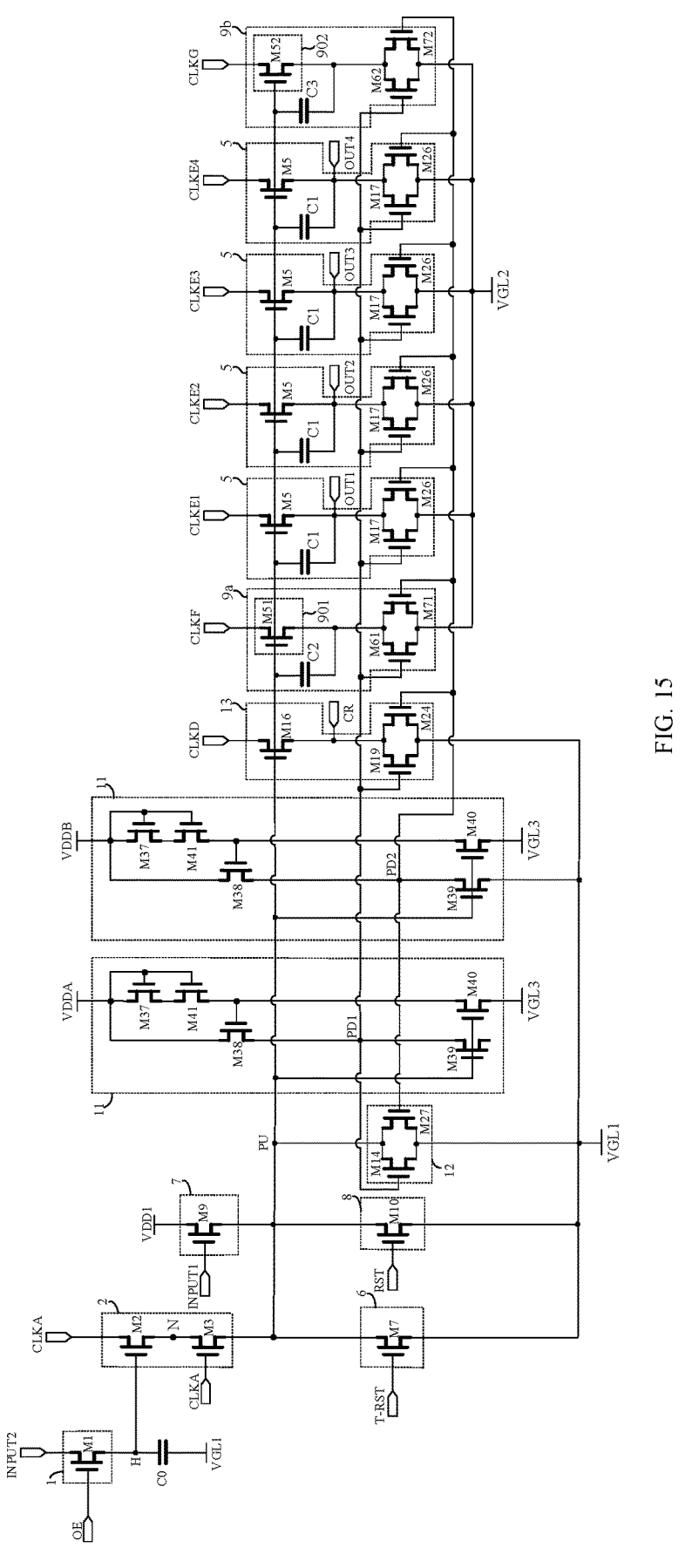
FIG. 15 is a schematic diagram of yet another circuit structure of a shift register unit according to the present disclosure.
Figure 16:
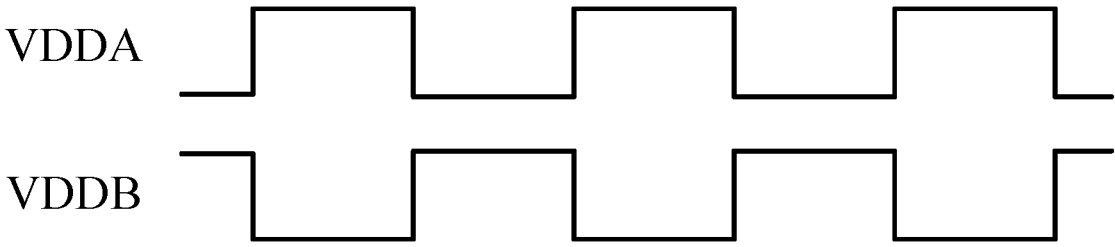
FIG. 16 is a timing diagram illustrating an operation of two active level supply terminals according to embodiments of the present disclosure.

FIG. 15 is a schematic diagram of yet another circuit structure of a shift register unit according to the present disclosure; FIG. 16 is a timing diagram illustrating an operation of two active level supply terminals according to the embodiments of the present disclosure. As shown in FIGS. 15 and 16, the shift register circuit in the shift register unit in the scheme shown in FIG. 15 includes two pull-down control circuits 11, unlike the case shown in the previous embodiments where the shift register circuit in the shift register unit includes only one pull-down control circuit 11.

Specifically, the number of the pull-down control circuits 11 is two, which are respectively a first pull-down control circuit 11 and a second pull-down control circuit 11; the number of the pull-down nodes is two, which are a first pull-down node PD1 and a second pull-down node PD2 respectively; the number of the active level supply terminals is two, which are a first active level supply terminal and a second active level supply terminal respectively; the first pull-down control circuit 11 is connected to the first pull-down node PD1 and the first active level supply terminal, and the second pull-down control circuit 11 is connected to the second pull-down node PD2 and the second active level supply terminal.

The first active level supply terminal provides a voltage VDDA and the second active level supply terminal provides a voltage VDDB, VDDA and VDDB are alternately at an active level. That is, the first pull-down control circuit 11 and the second pull-down control circuit 11 operate alternately. With such the design, each pull-down node PD can be effectively prevented from being at a high voltage for a long time, which is favorable to promoting the life of the transistors whose control electrodes are connected to the pull-down nodes PD1, PD2.

Each driving output sub-circuit 501 is connected to both the first pull-down node PD1 and the second pull-down node PD2, and is configured to write a non-active level signal provided by the fourth power supply terminal to the corresponding driving signal output terminal OUT when at least one of the first pull-down node PD1 and the second pull-down node PD2 is at an active level.

As an example, each driving output sub-circuit 501 includes not only the fifth transistor M5 and the seventeenth transistor M17 in the foregoing embodiments, but also a seventy-seventh transistor M77. The control electrode of the seventeenth transistor M17 is connected to the first pull-down node PD1, and a control electrode of the seventy-seventh transistor M77 is connected to the second pull-down node PD2.

When the cascade output circuit 13 is included in the shift register circuit, the cascade output circuit 13 is connected to both the first pull-down node PD1 and the second pull-down node PD2, and is configured to write a non-active level signal provided by the second power supply terminal to the driving signal output terminal when at least one of the first pull-down node PD1 and the second pull-down node PD2 is at an active level.

As an example, the cascade output circuit 13 includes not only the sixteenth transistor M16 and the nineteenth transistor M19 in the previous embodiments but also a seventy-ninth transistor M79. The control electrode of the nineteenth transistor M19 is connected to the first pull-down node PD1, and a control electrode of the seventy-ninth transistor M is connected to the second pull-down node PD2.

When the first reset sub-circuit 903 is included in the shift register circuit, the first reset sub-circuit 903 is connected to both the first pull-down node PD1 and the second pull-down node PD2, and is configured to write a non-active level signal provided by the fourth power supply terminal to the second terminal of the second capacitor C2 when at least one of the first pull-down node PD1 and the second pull-down node PD2 is at an active level.

As an example, the first reset sub-circuit 903 includes not only the sixty-first transistor M61 in the previous embodiments but also a seventy-first transistor M71. The control electrode of the sixty-first transistor M61 is connected to the first pull-down node PD1, and a control electrode of the seventy-first transistor M71 is connected to the second pull-down node PD2.

When the second reset sub-circuit 904 is included in the shift register circuit, the second reset sub-circuit 904 is connected to both the first pull-down node PD1 and the second pull-down node PD2, and is configured to write a non-active level signal provided by the fourth power supply terminal to the second terminal of the third capacitor C3 when at least one of the first pull-down node PD1 and the second pull-down node PD2 is at an active level.

As an example, the second reset sub-circuit 904 includes not only the sixty-second transistor M62 in the previous embodiments but also a seventy-second transistor M72. The control electrode of the sixty-second transistor M62 is connected to the first pull-down node PD1, and a control electrode of the seventy-second transistor M72 is connected to the second pull-down node PD2.

When the pull-up noise reduction circuit 12 is included in the shift register circuit, the pull-up noise reduction circuit 12 is connected to both the first pull-down node PD1 and the second pull-down node PD2, and is configured to write an active level signal provided by the second power supply terminal to the pull-up node PU when at least one of the first pull-down node PD1 and the second pull-down node PD2 is at an active level.

As an example, the pull-up noise reduction circuit 12 includes not only the fourteenth transistor M14 in the previous embodiments but also a twenty-seventh transistor M27. The control electrode of the fourteenth transistor M14 is connected to the first pull-down node PD1, and a control electrode of the twenty-seventh transistor M27 is connected to the second pull-down node PD2.

It should be noted that FIG. 15 only shows that each pull-down control circuit 11 includes the thirty-seventh transistor M37 to the forty-first transistor M41, which only serves as an example, and does not limit the technical solution of the present disclosure. In the present disclosure, any circuit having a function of inverting a voltage may be used as the pull-down control circuit 11 in the present disclosure, which is not enumerated here.

Figure 17:
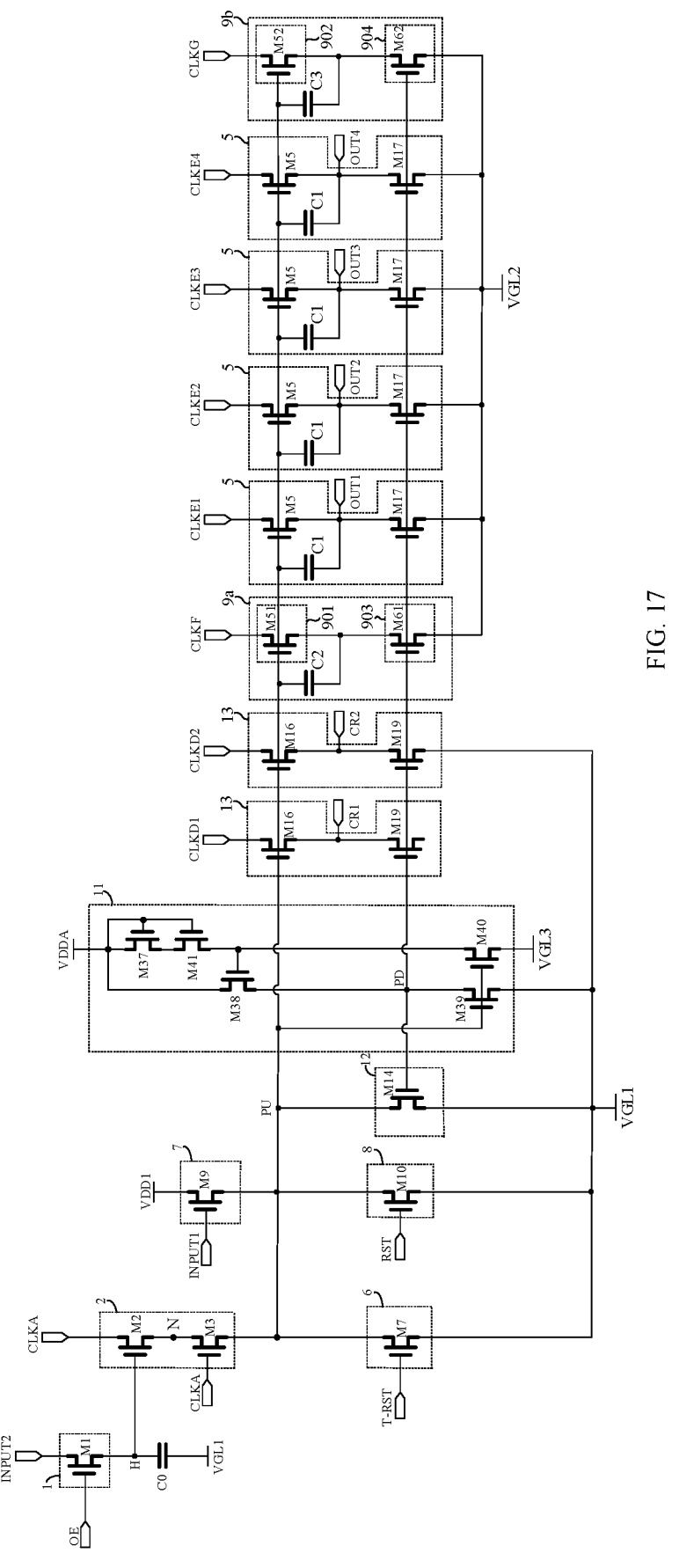
FIG. 17 is a schematic diagram of yet another circuit structure of a shift register unit according to embodiments of the present disclosure.

FIG. 17 is a schematic diagram of yet another circuit structure of a shift register unit according to the present disclosure. As shown in FIG. 17, the shift register circuit in the shift register unit shown in FIG. 17 includes two cascade output circuits 13, and one of them is configured to output a reset cascade pulse and the other one is configured to output an input cascade pulse.

It is found in practical applications that a portion of each shift register circuit for implementing the display cascade includes the display input circuit 7 and the display reset circuit 8; the display input circuit 7 is provided with the display signal input terminal INPUT1; the display reset circuit 8 is provided with a display reset signal input terminal; the display signal input terminal INPUT1 is used for receiving the input cascade pulse, and the display reset signal input terminal RST is used for receiving the reset cascade pulse.

Therefore, for a shift register circuit of any stage, it needs to provide a reset cascade pulse for a shift register circuit of a previous stage (preset according to cascade requirement), so as to control the corresponding shift register circuit to perform the corresponding display reset phase t3; meanwhile, it also needs to provide an input cascade pulse for a shift register circuit of a posterior stage (preset according to cascade requirement), so as to control the corresponding shift register to perform the corresponding display input phase t1.

In the related art, one cascade output circuit 13 is provided in the shift register circuit, and the pulse output from the cascade output circuit 13 is used as both the reset cascade pulse and the input cascade pulse. There may be following problems in the related art: 1) a cascade signal output terminal of the cascade output circuit 13 is necessarily connected to a display reset signal input terminal of a shift register circuit of a previous stage, and to a display signal input terminal INPUT1 of a shift register circuit of a posterior stage, and thus, the cascade signal output terminal has a large load, which is not beneficial to the output of the cascade signal output terminal; 2) the pulse output by the one cascade output circuit 13 is used as the reset cascade pulse and the input cascade pulse, so that it is necessary to consider operating processes of three shift register circuits (i.e., the shift register circuit of the present stage and the two shift register circuits connected to the cascade signal output terminal of the shift register circuit of the present stage) at the same time in terms of the timing design, and in order to ensure that the shift register circuit can normally output the display driving pulse, it is often necessary to provide a longer time period from the end of the display input phase t1 to the start of the display reset phase t3 by design, during which the pull-up node PU is in a floating state for a long time, so that the risk of the serious drift caused by the voltage at the pull-up node PU influenced by external factors (for example, external electromagnetic field interference) is increased.

In order to effectively improve the technical problems, in the embodiments of the present disclosure, two cascade output circuits 13 are disposed in the shift register circuit, and a cascade signal output terminal CR1 of one of the two cascade output circuits 13 is connected to a display reset signal input terminal of a shift register circuit of a stage before the shift register circuit of the present stage, so as to provide the reset cascade pulse to the display reset signal input terminal of the shift register circuit; a cascade signal output terminal CR2 of the other of the two cascade output circuits 13 is connected to a display signal input terminal INPUT1 of a shift register circuit of a stage after the shift register circuit of the present stage, so as to provide the input cascade pulse to the display signal input terminal INPUT1 of the shift register circuit.

That is, the shift register unit of the present stage may output the reset cascade pulse and the input cascade pulse respectively, and a timing of the reset cascade pulse and a timing of the input cascade pulse may be different from each other. When the operating timing of the shift register circuit of the present stage is designed, it is unnecessary to consider the operating processes of three shift register circuits (the shift register circuit of the present stage and two shift register circuits connected to the cascade signal output terminal of the shift register circuit of the present stage), so that the timing design is more free. Accordingly, on the premise that the shift register circuit can normally output the display driving pulse, the time period from the end of the display input phase t1 to the start of the display reset phase t3 may be shortened, so that the time for the pull-up node PU being in the floating state is shortened, and the risk of the voltage drift at the pull-up node PU is reduced. Meanwhile, one cascade signal output terminal CR1 or CR2 of the shift register circuit of the present stage is only connected to the display reset signal input terminal or the display signal input terminal INPUT1 of the other shift register circuit. Therefore, the load of the cascade signal output terminal CR1 can be effectively reduced, which is beneficial to the stable output of the cascade signal output terminal.

In some embodiments, in the same shift register circuit, a moment at which the cascade output circuit 13 configured to output the reset cascade pulse starts outputting the reset cascade pulse precedes a moment at which the cascade output circuit 13 configured to output the input cascade pulse starts outputting the input cascade pulse. Specifically this control may be implemented by configuring the signals provided by the two cascade clock signal input terminals CLKD1 and CLKD2. With such the design, the normal operation of the shift register circuit can be ensured, and the time period from the end of the display input phase t1 to the start of the display reset phase t3 can be effectively shortened in the operation process of the shift register circuit.

Figure 18:
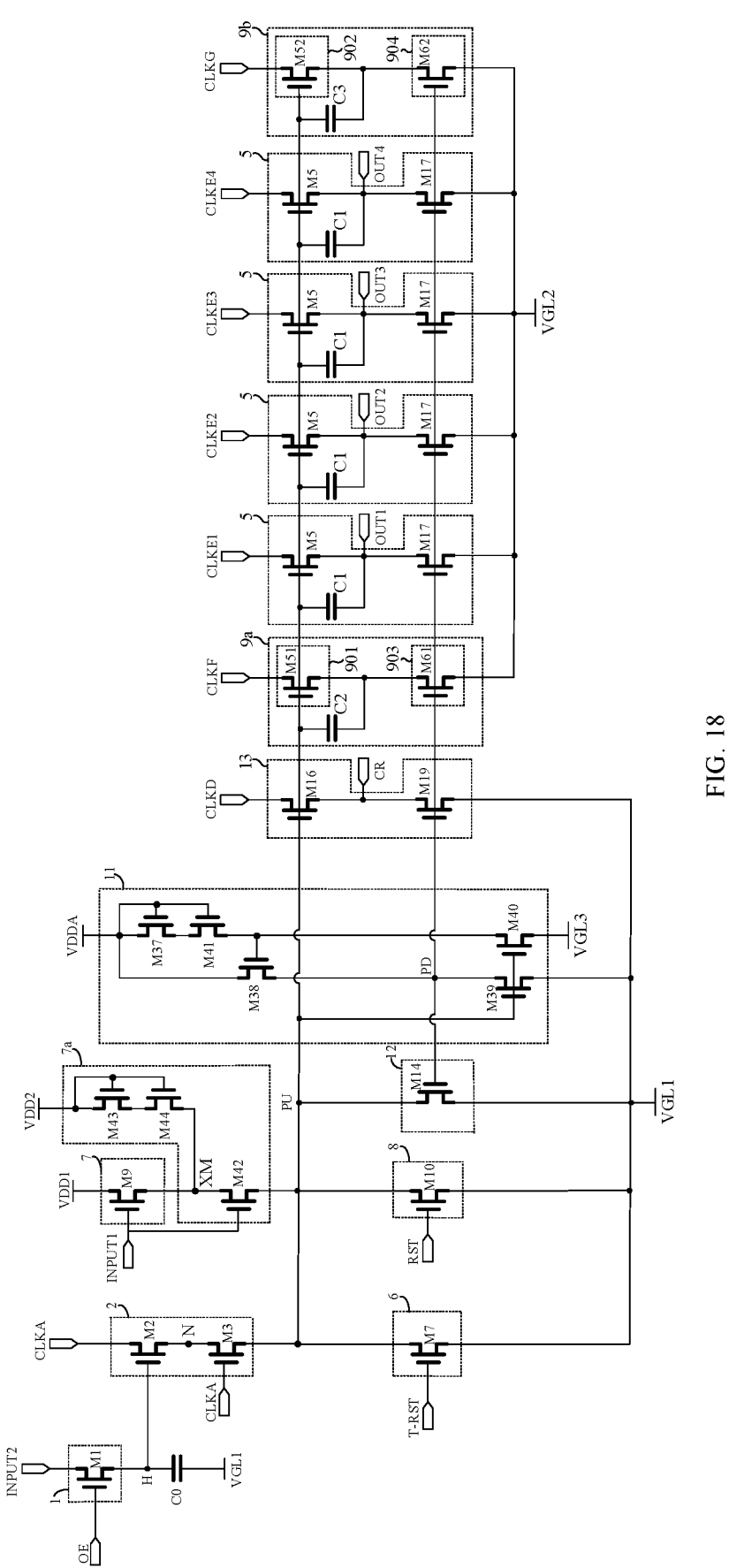
FIG. 18 is a schematic diagram of yet another circuit structure of a shift register unit according to embodiments of the present disclosure.

FIG. 18 is a schematic diagram of yet another circuit structure of a shift register unit according to embodiments of the present disclosure. As shown in FIG. 18, in some embodiments, the shift register circuit further includes: a display input auxiliary circuit 7a; the display input circuit 7 is connected to the pull-up node PU through the display input auxiliary circuit 7a, and the display input circuit 7 and the display input auxiliary circuit 7a are connected to each other at a display intermediate node XM.

The display input auxiliary circuit 7a is further connected to a sixth power supply terminal, the display signal input terminal INPUT1 and the pull-up node PU, and is configured to write an active level signal provided from the sixth power supply terminal to the pull-up node PU in response to an active level signal provided from the display signal input terminal INPUT1, and to electrically disconnect the display intermediate node XM from the pull-up node PU in response to a non-active level signal provided from the random signal input terminal OE, and to write the active level signal provided from the sixth power supply terminal to the display intermediate node XM.

In some embodiments, the sixth power supply terminal provides a high level voltage VDD2, VDD2 is equal to VDD1.

In the embodiments of the present disclosure, when the display signal input terminal INPUT1 provides an active level signal, the display input circuit 7 and the display input auxiliary circuit 7a may charge the pull-up node PU at the same time, so that the voltage at the pull-up node PU may be pulled up quickly, which is beneficial to accurately controlling the operating process of the shift register circuit.

In some embodiments, the display input auxiliary circuit 7a includes: a forty-second transistor M42 and a forty-third transistor M43; a control electrode of the forty-second transistor M42 is connected to the display signal input terminal INPUT1, a first electrode of the forty-second transistor M42 is connected to the display intermediate node XM, and a second electrode of the forty-second transistor M42 is connected to the pull-up node PU; a control electrode of the forty-third transistor M43 is connected to the sixth power supply terminal, a first electrode of the forty-third transistor M43 is connected to the control electrode of the forty-third transistor M43, and a second electrode of the forty-third transistor M43 is connected to the display intermediate node XM.

In some embodiments, the display input auxiliary circuit 7a further includes: a forty-fourth transistor M44; the second electrode of the forty-third transistor M43 is connected to the display intermediate node XM through the forty-fourth transistor M44; a control electrode of the forty-fourth transistor M44 is connected to the control electrode of the forty-third transistor M43, a first electrode of the forty-fourth transistor M44 is connected to the second electrode of the forty-third transistor M43, and a second electrode of the forty-fourth transistor M44 is connected to the display intermediate node XM.

Similar to the above description of reducing the charging current by providing the forty-first transistor M41, in the embodiments of the present disclosure, by providing the forty-fourth transistor M44 between the second electrode of the forty-third transistor M43 and the display intermediate node XM, the charging current between the sixth power supply terminal and the display intermediate node XM can be effectively reduced, so as to avoid the problem that the forty-third transistor M43 is damaged due to the excessive charging current.

Figure 19:
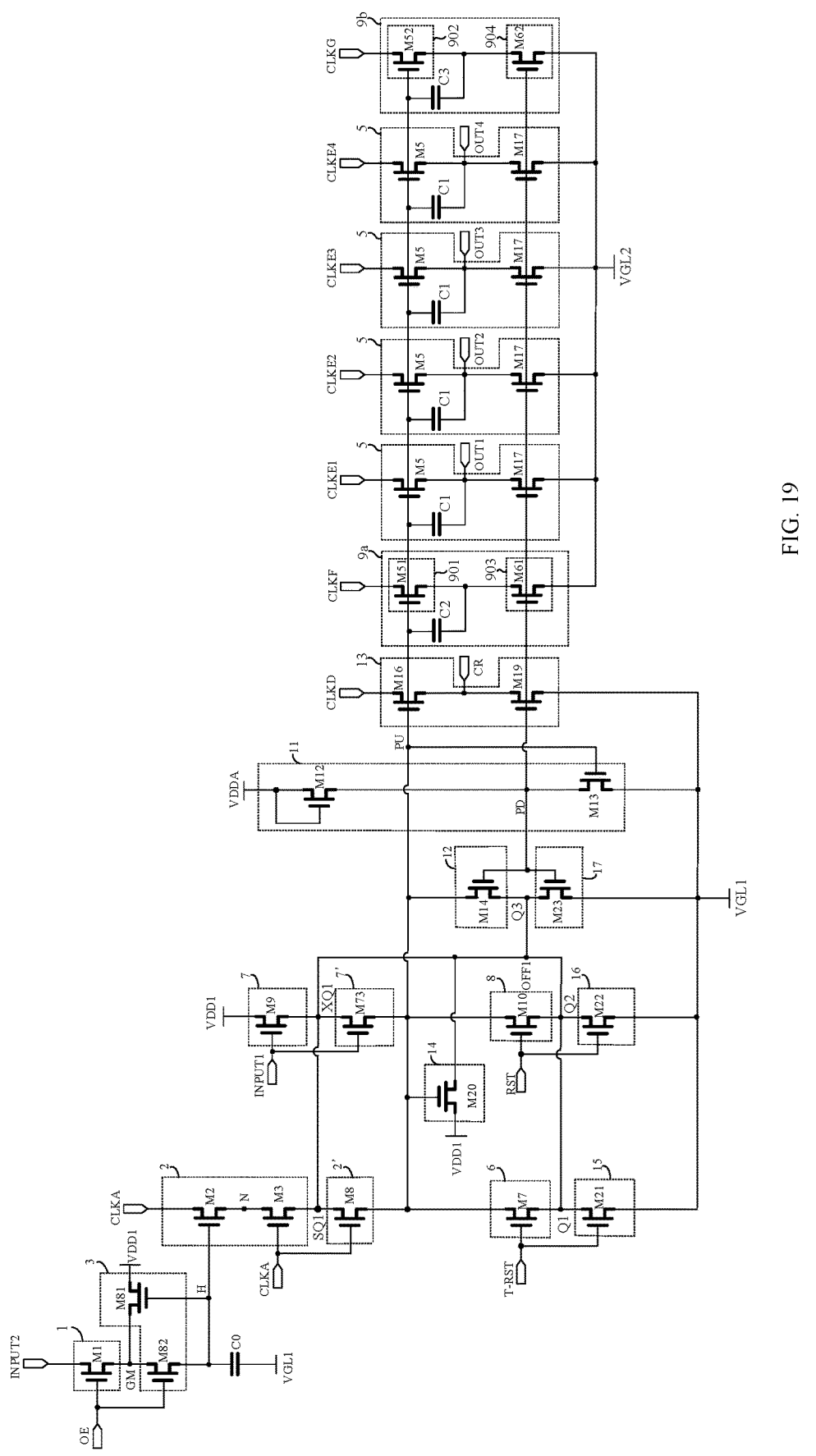
FIG. 19 is a schematic diagram of yet another circuit structure of a shift register unit according to embodiments of the present disclosure.

FIG. 19 is a schematic diagram of yet another circuit structure of a shift register unit according to embodiments of the present disclosure. As shown in FIG. 19, when the sensing control circuit 1 and the sensing input circuit 2 are included in the shift register circuit, in some embodiments, the shift register circuit further includes: a sensing control leakage preventing circuit 3.

The sensing control circuit 1 is connected to the sensing control node H through the sensing control leakage preventing circuit 3; the sensing control leakage preventing circuit 3 and the sensing control circuit 1 are connected to each other at a sensing control leakage preventing node GM; the sensing control leakage preventing circuit 3 is further connected to the first power supply terminal, the sensing control node H and the random signal input terminal OE, and is configured to write an active level signal provided by the first power supply terminal to the sensing control leakage preventing node GM in response to an active level signal at the sensing control node H, and is further configured to electrically connect the sensing control leakage preventing node GM and the sensing control node H in response to an active level signal provided from the random signal input terminal OE, and electrically disconnect the sensing control leakage preventing node GM from the sensing control node H in response to a non-active level signal provided from the random signal input terminal OE.

In some embodiments, the sensing control leakage preventing circuit 3 includes an eighty-first transistor M81 and an eighty-second transistor M82.

A control electrode of the eighty-first transistor M81 is connected to the sensing control node H, a first electrode of the eighty-first transistor M81 is connected to the first power supply terminal, and a second electrode of the eighty-first transistor M81 is connected to the sensing input leakage preventing node.

A control electrode of the eighty-second transistor M82 is connected to the random signal input terminal OE, a first electrode of the eighty-second transistor M82 is connected to the sensing input leakage preventing node, and a second electrode of the eighty-second transistor M82 is connected to the sensing control node H.

In some embodiments, the shift register circuit further includes: a first voltage control circuit 14; the first voltage control circuit 14 is connected to the third power supply terminal, the pull-up node PU and a first voltage control node OFF1, and is configured to write an active level signal provided by the third power supply terminal to the first voltage control node OFF1 in response to an active level signal at the pull-up node PU.

As an example, the third power supply terminal provides an active level voltage VDD1.

The shift register further includes: a sensing input leakage preventing circuit 7'; the sensing input circuit 2 is connected to the pull-up node PU through the sensing input leakage preventing circuit 7'; the sensing input circuit 2 and the sensing input leakage preventing circuit 7' are connected to each other at a sensing input leakage preventing node SQ1; the sensing input leakage preventing node SQ1 is connected to the first voltage control node OFF1; the sensing input leakage preventing circuit 2' is connected to a clock control signal input terminal, and is configured to electrically connect the sensing input leakage preventing node SQ1 and the pull-up node PU in response to an active level signal provided from the clock control signal input terminal, and to electrically disconnect the sensing input leakage preventing node SQ1 from the pull-up node PU in response to a non-active level signal provided from the clock control signal input terminal CLKA.

In some embodiments, the first voltage control circuit 14 includes: a twentieth transistor M20; a control electrode of the twentieth transistor M20 is connected to the pull-up node PU, a first electrode of the twentieth transistor M20 is connected to the first power supply terminal, and a second electrode of the twentieth transistor M20 is connected to the first voltage control node OFF1.

In some embodiments, the sensing input leakage preventing circuit 2' includes an eighth transistor M8; a control electrode of the eighth transistor M8 is connected to the clock control signal input terminal CLKA, a first electrode of the eighth transistor M8 is connected to the sensing input leakage preventing node SQ1, and a second electrode of the eighth transistor M8 is connected to the pull-up node PU.

In some embodiments, the shift register circuit further includes: at least one of a first leakage preventing circuit 15, a second leakage preventing circuit 16, and a third leakage preventing circuit 17;

The global reset circuit 6 is connected to the second power supply terminal through the first leakage preventing circuit 15; the global reset circuit 6 is connected to the first leakage preventing circuit 15 at a first leakage preventing node Q1; the first leakage preventing node Q1 is connected to the first voltage control node OFF1; the first leakage preventing circuit 15 is connected to the global reset signal input terminal T-RST, and is configured to electrically connect the first leakage preventing node Q1 and the second power supply terminal in response to an active level signal provided from the global reset signal input terminal T-RST, and electrically disconnect the first leakage preventing node Q1 from the second power supply terminal in response to a non-active level signal provided from the global reset signal input terminal T-RST.

The display reset circuit 8 is connected to the second power supply terminal through the second leakage preventing circuit 16; the display reset circuit 8 and the second leakage preventing circuit 16 are connected to each other at a second leakage preventing node Q2; the second leakage preventing node Q2 is connected to the first voltage control node OFF1; the second leakage preventing circuit 16 is connected to the display reset signal input terminal RST, and is configured to electrically connect the second leakage preventing node Q2 and the second power supply terminal in response to an active level signal provided from the display reset signal input terminal, and to electrically disconnect the second leakage preventing node Q2 from the second power supply terminal in response to a non-active level signal provided from the display reset signal input terminal.

The pull-up noise reduction circuit 12 is connected to the second power supply terminal through the third leakage preventing circuit 17; the pull-up noise reduction circuit 12 is connected to the third leakage preventing circuit 17 at a third leakage preventing node Q3; the third leakage preventing node Q3 is connected to the first voltage control node OFF1; the third leakage preventing circuit 17 is connected to the pull-down node PD, and is configured to electrically connect the third leakage preventing node Q3 and the second power supply terminal in response to an active level signal of the pull-down node PD, and to electrically disconnect the third leakage preventing node Q3 from the second power supply terminal in response to a non-active level signal of the pull-down node PD.

In some embodiments, the first leakage preventing circuit 15 includes a twenty-first transistor M21, a control electrode of the twenty-first transistor M21 is connected to the global reset signal input terminal T-RST, a first electrode of the twenty-first transistor M21 is connected to the first leakage preventing node Q1, and a second electrode of the twenty-first transistor M21 is connected to the second power supply terminal.

In some embodiments, the second leakage preventing circuit 16 includes a twenty-second transistor M22, a control electrode of the twenty-second transistor M22 is connected to the display reset signal input terminal, a first electrode of the twenty-second transistor M22 is connected to the second leakage preventing node Q2, and a second electrode of the twenty-second transistor M22 is connected to the second power supply terminal.

In some embodiments, the third leakage preventing circuit 17 includes: a twenty-third transistor M23; a control electrode of the twenty-third transistor M23 is connected to the first pull-down node PD, a first electrode of the twenty-third transistor M23 is connected to the third leakage preventing node Q3, and a second electrode of the twenty-third transistor M23 is connected to the second power supply terminal.

It should be noted that FIG. 19 exemplarily shows that the shift register unit includes the first leakage preventing circuit 15, the second leakage preventing circuit 16 and the third leakage preventing circuit 17. In practical applications, at least one of the first leakage preventing circuit 15, the second leakage preventing circuit 16 and the third leakage preventing circuit 17 may be disposed according to actual needs.

Figure 20:
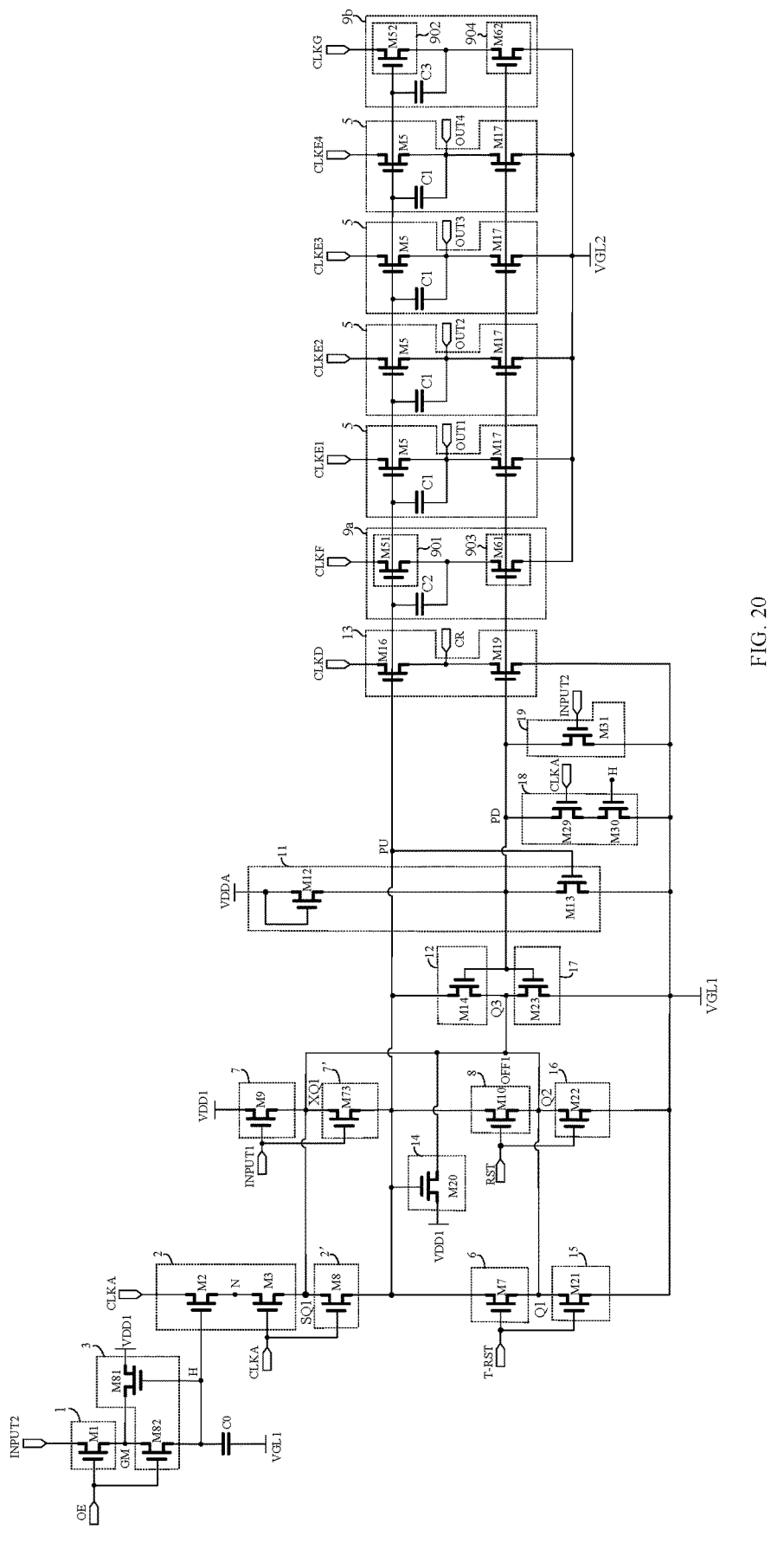
FIG. 20 is a schematic diagram of yet another circuit structure of a shift register unit according to embodiments of the present disclosure.

FIG. 20 is a schematic diagram of yet another circuit structure of a shift register unit according to embodiments of the present disclosure. As shown in FIG. 20, in some embodiments, the shift register unit further includes a first pull-down noise reduction circuit 18 and/or a second pull-down noise reduction circuit 19.

The first pull-down noise reduction circuit 18 is connected to the pull-down node PD, the second power supply terminal, the sensing control node H and the clock control signal input terminal, and is configured to write a non-active level signal provided by the second power supply terminal to the pull-down node PD in response to an active level signal at the sensing control node H and an active level signal provided by the clock control signal input terminal, so as to perform noise reduction processing on a voltage at the pull-down node PD.

The second pull-down noise reduction circuit 19 is connected to the pull-down node PD, the second power supply terminal, and the sensing signal input terminal, and is configured to write a non-active level signal provided by the second power supply terminal to the pull-down node PD in response to an active level signal provided by the sensing signal input terminal, so as to perform noise reduction processing on the voltage at the pull-down node PD.

In some embodiments, the first pull-down noise reduction circuit 18 includes a twenty-ninth transistor M29 and a thirtieth transistor M30, and the second pull-down noise reduction circuit 19 includes a thirty-first transistor M31.

A control electrode of the twenty-ninth transistor M29 is connected to the clock control signal input terminal, a first electrode of the twenty-ninth transistor M29 is connected to the pull-down node PD, and a second electrode of the twenty-ninth transistor M29 is connected to a first electrode of the thirtieth transistor M30.

A control electrode of the thirtieth transistor M30 is connected to the sensing control node H, and a second electrode of the thirtieth transistor M30 is connected to the second power supply terminal.

A control electrode of the thirty-first transistor M31 is connected to the second sensing signal input terminal INPUT2, a first electrode of the thirty-first transistor M31 is connected to the pull-down node PD, and a second electrode of the thirty-first transistor M31 is connected to the second power supply terminal.

Figure 21:
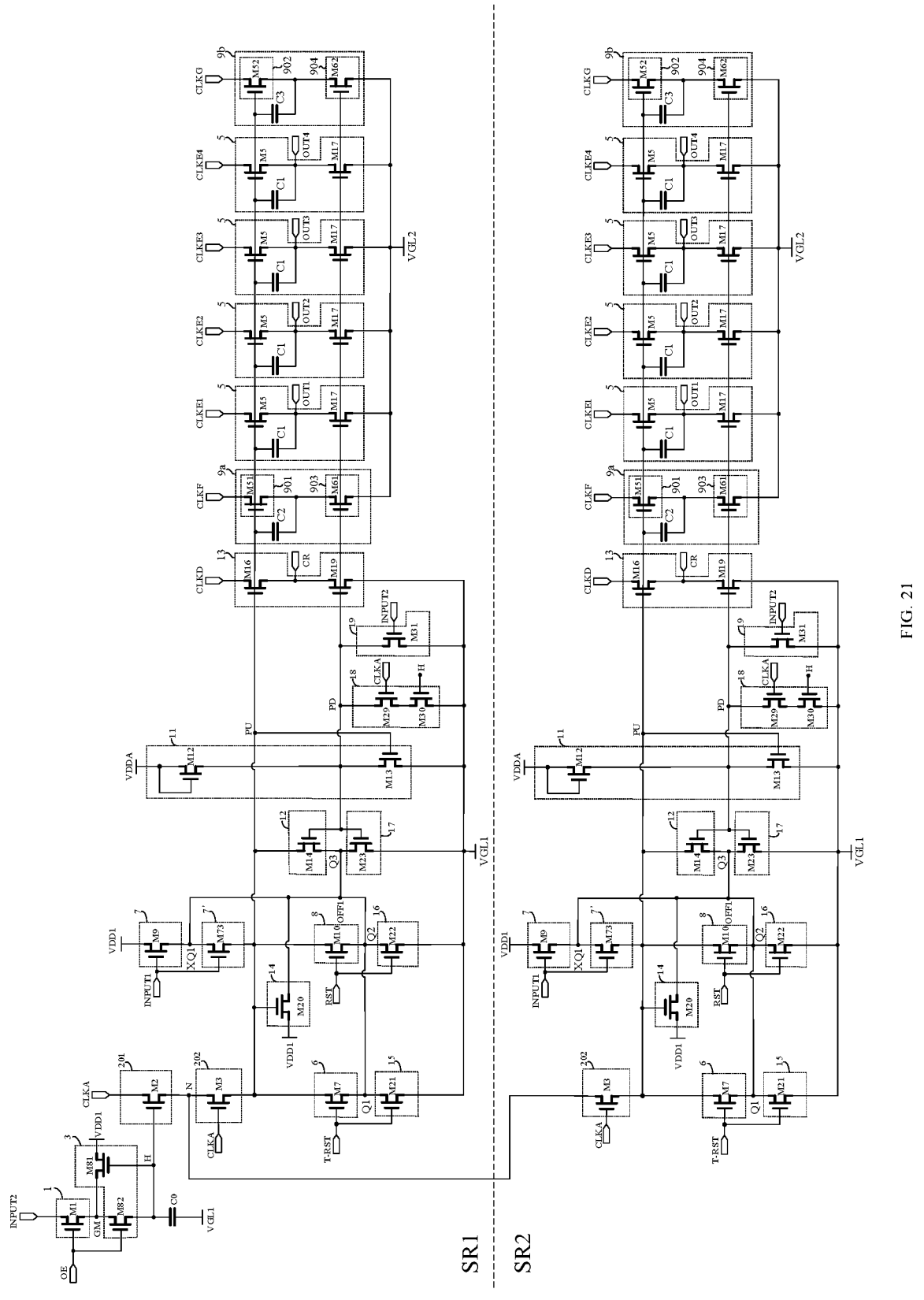
FIG. 21 is a schematic diagram of yet another circuit structure of a shift register unit according to embodiments of the present disclosure.

FIG. 21 is a schematic diagram of yet another circuit structure of a shift register unit according to embodiments of the present disclosure. As shown in FIG. 21, unlike the previous embodiments in which the shift register unit includes one shift register circuit, in the embodiments as shown in FIG. 21, the shift register unit includes two shift register circuits SR1 and SR2. The related description of the shift register circuits SR1 and SR2 may be found in the previous embodiments.

In some embodiments, each of the shift register circuits SR1 and SR2 includes one sensing control circuit 1 and one sensing input circuit 2, and the sensing input circuit 2 includes: a first input sub-circuit 201 and a second input sub-circuit 202.

The first input sub-circuit 201 is connected to the sensing control node H and the sensing intermediate node N, and is configured to write an active level signal to the sensing intermediate node N in response to the active level signal at the sensing control node H. The second input sub-circuit 202 is connected to the sensing intermediate node N and the clock control signal input terminal, and is configured to electrically connect the sensing intermediate node N and the pull-up node PU in response to an active level signal provided by the clock control signal input terminal CLKA. As an example, the first input sub-circuit 201 includes the second transistor M2, and the second input sub-circuit 202 includes the third transistor M3.

In the embodiments of the present disclosure, the two shift register circuits SR1, SR2 share the same sensing control circuit 1 and the same first input sub-circuit 201. By the design, the number of the transistors in the gate driving circuit can be effectively reduced, and the whole space occupied by the gate driving circuit is favorably reduced.

Figure 22:
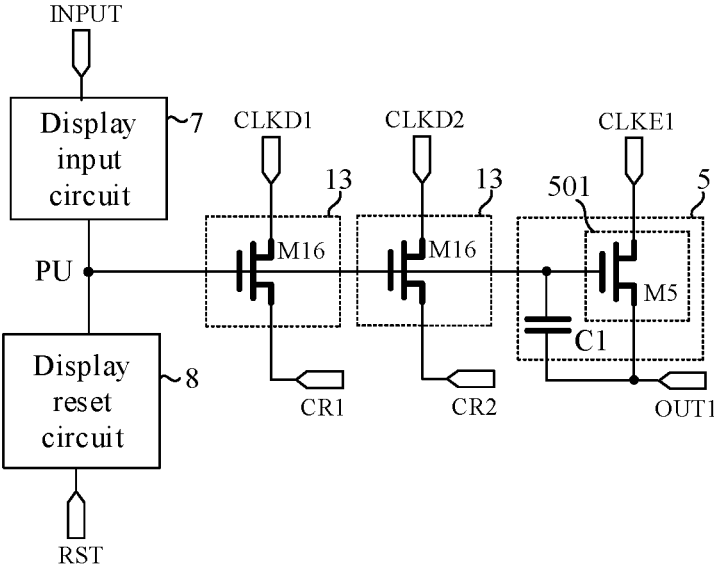
FIG. 22 is a schematic diagram of yet another circuit structure of a shift register unit according to embodiments of the present disclosure.

FIG. 22 is a schematic diagram of yet another circuit structure of a shift register unit according to embodiments of the present disclosure. As shown in FIG. 22, the shift register unit includes: a shift register circuit, including: the display input circuit 7, the display reset circuit 8, at least one driving output circuit 5 and two cascade output circuits 13.

The display input circuit 7 is connected to the display signal input terminal INPUT1 and the pull-up node PU, and is configured to write an active level signal to the pull-up node PU in response to the active level signal provided by the display signal input terminal INPUT1.

The display reset circuit 8 is connected to the display reset signal input terminal RST, the second power supply terminal, and the pull-up node PU, and is configured to write a non-active level signal provided from the second power supply terminal to the pull-up node PU in response to an active level signal provided from the display reset signal input terminal RST.

The driving output circuit 5 includes: a driving output sub-circuit 501 and a first capacitor C1; the driving output sub-circuit 501 is connected to the pull-up node PU, a corresponding driving clock signal input terminal CLKE1 and a corresponding driving signal output terminal OUT1, and is configured to write a signal provided by the driving clock signal input terminal CLKE1 to the driving signal output terminal in response to an active level signal at the pull-up node PU; a first terminal of the first capacitor C1 is connected to the pull-up node PU, and a second terminal of the first capacitor C1 is connected to the driving signal output terminal OUT1.

Each cascade output circuit 13 is connected to the pull-up node PU, a corresponding one of the cascade clock signal input terminals CLKD1, CLKD2, and a corresponding one of the cascade signal output terminals CR1, CR2, and is configured to write a signal provided by the corresponding one of the cascade clock signal input terminals CLKD1, CLKD2 to the corresponding one of the cascade signal output terminals CR1, CR2 in response to a voltage at the pull-up node PU. One of the two cascade output circuits 13 is configured to output the reset cascade pulse, and the other is configured to output the input cascade pulse.

In some embodiments, the number of the driving output circuits 5 may be greater than 1, such as 2, 4, or the like as in the previous embodiments. Alternatively, when the number of the driving output circuits 5 is greater than 1, the shift register circuit in the shift register unit shown in FIG. 22 may be provided with the first pull-up voltage stabilizing circuit VR1 and second pull-up voltage stabilizing circuit VR2.

In addition, the shift register circuit in the shift register unit shown in FIG. 22 may selectively include the pull-down control circuit 11, the pull-up noise reduction circuit 12 the sensing control circuit 1, the sensing input circuit 2, the global reset circuit 6, the first pull-down noise reduction circuit 18, the second pull-down noise reduction circuit 19, the display input auxiliary circuit 7a, and at least one of the leakage preventing circuits in the previous embodiments, which is not enumerated here.

It should be noted that a new circuit structure of the shift register unit may be obtained by combining some circuit structures in the above embodiments, and also belong to the scope of the present disclosure.

Figure 23:
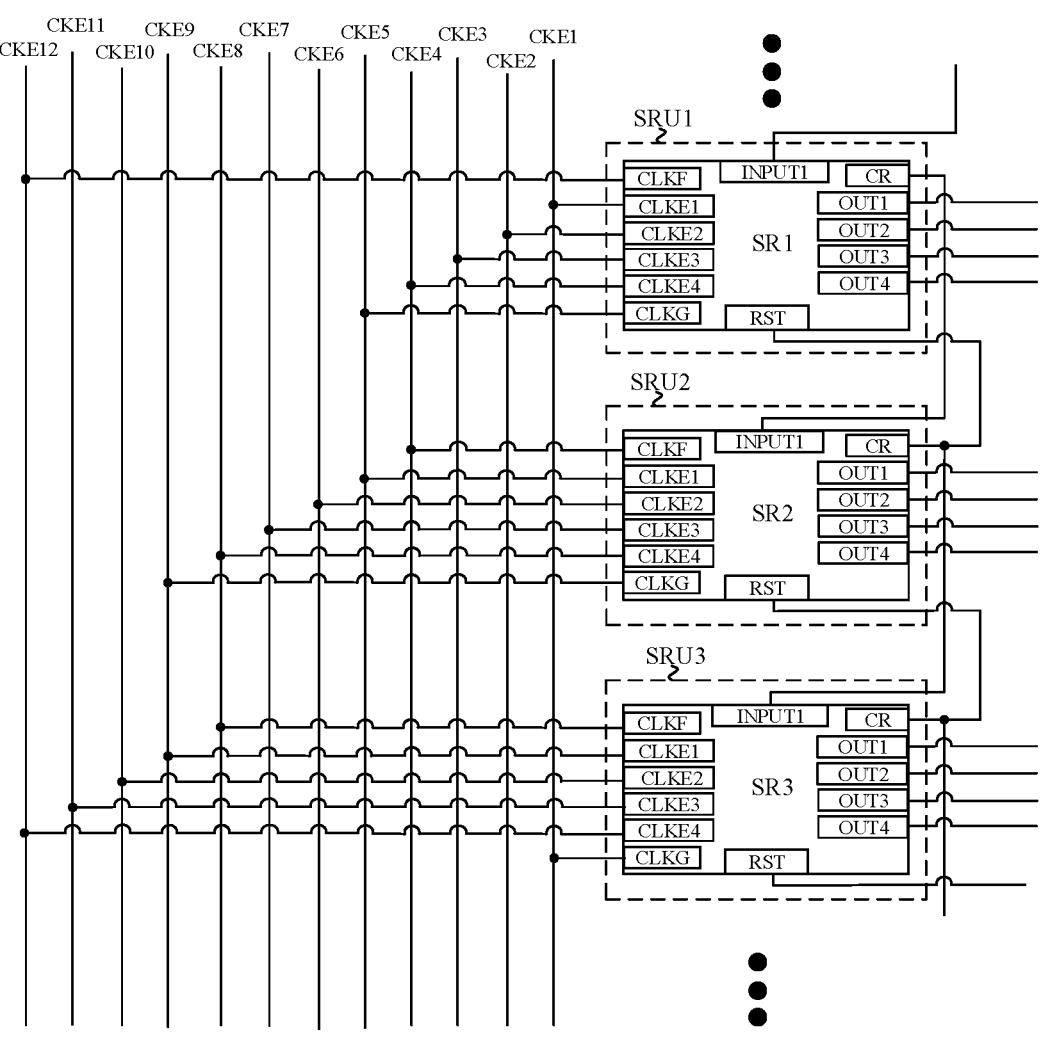
FIG. 23 is a schematic diagram of a circuit structure of a gate driving circuit according to embodiments of the present disclosure.
Figure 24:
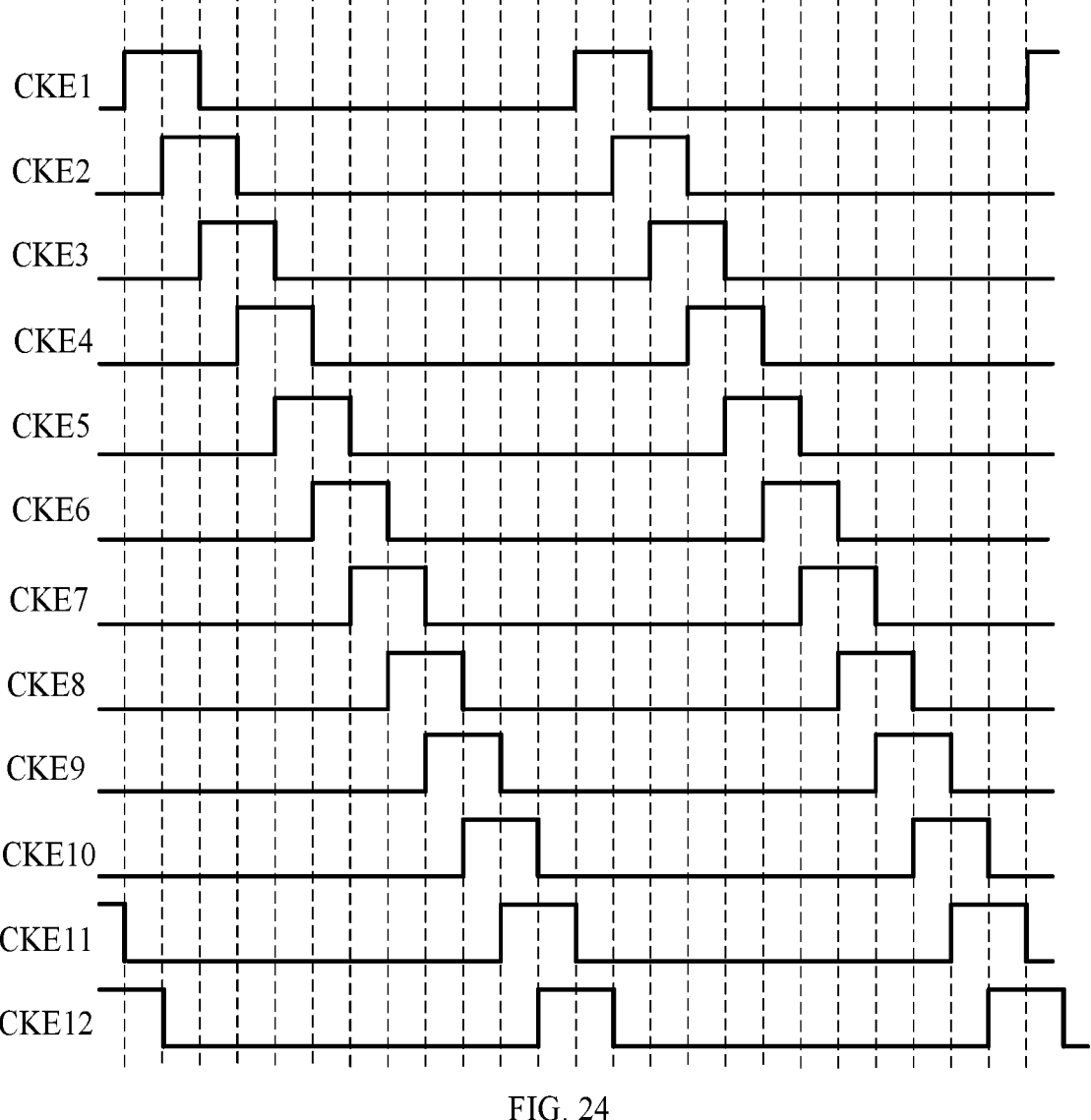
FIG. 24 is a timing diagram illustrating an operation of the gate driving circuit shown in FIG. 23.

Based on the same inventive concept, the embodiments of the present disclosure further provide a gate driving circuit. FIG. 23 is a schematic diagram of a circuit structure of a gate driving circuit according to embodiments of the present disclosure; and FIG. 24 is a timing diagram illustrating an operation of the gate driving circuit shown in FIG. 23. As shown in FIG. 23 and FIG. 24, the gate driving circuit includes a plurality of shift register units, where each shift register unit may adopt the shift register unit provided in any of the foregoing embodiments, and a plurality of shift register circuits included in the plurality of shift register units are cascaded; for the detailed description of the shift register circuit, reference may be made to the contents in the foregoing embodiments, and details are not repeated here.

FIG. 23 illustrates three shift register units SRU1 to SRU3, each of which includes one of shift register circuits SR1 to SR3; that is, three shift register circuits SR1 to SR3 are exemplarily shown in FIG. 23.

In some embodiments, each of the pull-up voltage stabilizing circuits includes the aforementioned m first voltage stabilizing sub-circuits and n second voltage stabilizing sub-circuits, and the gate driving circuit further includes: a plurality of clock supply signal lines capable of sequentially supplying clock pulses; the driving clock signal input terminals CLKE1 to CLKE4 of the driving output circuits are connected to the corresponding clock supply signal lines; the first voltage stabilizing clock signal input terminal CLKF of the first voltage stabilizing sub-circuit is connected to a corresponding clock supply signal line; the second voltage stabilizing clock signal input CLKG of the second voltage stabilizing sub-circuit is connected to a corresponding clock supply signal line.

As an example, the number of clock supply signal lines is twelve, and each shift register circuit includes four driving output circuits and one cascade output circuit. That is, each shift register circuit includes four driving clock signal input terminals CLKE1 to CLKE4, four driving signal output terminals OUT1 to OUT4, and one cascade signal output terminal CR.

Each pull-up voltage stabilizing circuit includes one first voltage stabilizing sub-circuit and one second voltage stabilizing sub-circuit. That is, each shift register circuit includes one first voltage stabilizing clock signal input terminal CLKF and one second voltage stabilizing clock signal input terminal CLKG.

The four driving clock signal input terminals CLKE1 to CLKE4 of the shift register circuit SR1 are respectively connected to the clock supply signal lines CKE1 to CKE4, the first voltage stabilizing clock signal input terminal CLKF of the shift register circuit SR1 is connected to the clock supply signal line CKE12, and the second voltage stabilizing clock signal input terminal CLKG of the shift register circuit SR1 is connected to the clock supply signal line CKE5.

The four driving clock signal input terminals CLKE1 to CLKE4 of the shift register circuit SR2 are connected to the clock supply signal lines CKE5 to CKE8, respectively, the first voltage stabilizing clock signal input terminal CLKF of the shift register circuit SR2 is connected to the clock supply signal line CKE4, and the second voltage stabilizing clock signal input terminal CLKG of the shift register circuit SR2 is connected to the clock supply signal line CKE9.

The four driving clock signal input terminals CLKE1 to CLKE4 of the shift register circuit SR3 are connected to the clock supply signal lines CKE9 to CKE12, respectively, the first voltage stabilizing clock signal input terminal CLKF of the shift register circuit SR3 is connected to the clock supply signal line CKE8, and the second voltage stabilizing clock signal input terminal CLKG of the shift register circuit SR3 is connected to the clock supply signal line CKE1.

In practical applications, the number of the driving clock signal input terminals CLKE1 to CLKE4, the number of the first voltage stabilizing clock signal input terminals CLKF, the number of the second voltage stabilizing clock signal input terminals CLKG, and the number of the clock supply signal lines (and timing design) configured for each shift register circuit may be provided such that the clock supply signal lines can provide signals not only to the driving clock signal input terminals CLKE1 to CLKE4, but also to the first voltage stabilizing clock signal input terminal CLKF and the second voltage stabilizing clock signal input terminal CLKG, thereby effectively reducing the number of wiring.

Based on the same inventive concept, embodiments of the present disclosure further provide a display panel, where the display panel includes the gate driving circuit provided in the foregoing embodiments, and for specific description of the gate driving circuit, reference may be made to the contents in the foregoing embodiments, and details are not repeated here.

In some embodiments, the gate driving circuit is formed on an array substrate of the display panel by means of a GOA.

Based on the same inventive concept, embodiments of the present disclosure further provide a display apparatus, where the display apparatus includes the display panel provided in the foregoing embodiments, and for specific description of the display panel, reference may be made to the contents in the foregoing embodiments, and details are not repeated here.

The display apparatus provided by the embodiments of the present disclosure may be any product or component with a display function, such as a liquid crystal display screen, a wearable device, a mobile phone, a tablet, a television, a display, a notebook computer, a digital photo frame, a navigator or the like. Other essential components of the display apparatus are understood by one of ordinary skill in the art to exist, and are not described herein and should not be used to limit the present disclosure.

It should be understood that, the above embodiments are merely exemplary embodiments adopted to explain the principles of the present disclosure, and the present disclosure is not limited thereto. It will be apparent to one of ordinary skill in the art that, various changes and modifications may be made without departing from the spirit and scope of the present disclosure, and such changes and modifications also fall within the scope of the present disclosure.

What is claimed is:

1. A shift register unit, comprising: a shift register circuit, wherein the shift register circuit comprises:

a display input circuit connected to a display signal input terminal and a pull-up node, and configured to write an active level signal to the pull-up node in response to an active level signal from the display signal input terminal; and at least two driving output circuits for sequentially outputting display driving pulses, wherein each driving output circuit is connected to the pull-up node, a driving clock signal input terminal and a driving signal output terminal, and is configured to write a signal from the driving clock signal input terminal to the driving signal output terminal in response to an active level signal at the pull-up node;

the shift register circuit further comprises both a first pull-up voltage stabilizing circuit and a second pull-up voltage stabilizing circuit;

the first pull-up voltage stabilizing circuit is connected to the pull-up node and at least configured to maintain a voltage at the pull-up node unchanged during a period in which a first driving output circuit of the at least two driving output circuits outputs the display driving pulse; and the second pull-up voltage stabilizing circuit is connected to the pull-up node and at least configured to maintain the voltage at the pull-up node unchanged during a period in which a last driving output circuit of the at least two driving output circuits outputs the display driving pulse;

the first pull-up voltage stabilizing circuit comprises at least one first voltage stabilizing sub-circuit, each of which comprises a fifty-first transistor, a sixty-first transistor and a second capacitor, and a second electrode of the fifty-first transistor, a first electrode of the sixty-first transistor and a second terminal of the second capacitor are electrically connected together;

the second pull-up voltage stabilizing circuit comprises at least one second voltage stabilizing sub-circuit, each of which comprises a fifty-second transistor, a sixty-second transistor and a third capacitor, and a second electrode of the fifty-second transistor, a first electrode of the sixty-second transistor and a second terminal of the third capacitor are electrically connected together;

the driving output circuit comprises a driving output sub-circuit, which comprises a fifth transistor, a seventeenth transistor and a first capacitor, and a second electrode of the fifth transistor, a first electrode of the seventeenth transistor and a second terminal of the first capacitor are electrically connected together, a control electrode of the fifty-first transistor, a control node of the fifth transistor, a control electrode of the fifty-second transistor, a first terminal of the first capacitor, a first terminal of the second capacitor and a first terminal of the third capacitor are all electrically connected to the pull-up node;

a control electrode of the sixty-first transistor, a control electrode of the sixty-second transistor, and a control electrode of the seventeenth transistor are electrically connected together;

a second electrode of the sixty-first transistor, a second electrode of the sixty-second transistor, and a second electrode of the seventeenth transistor are all electrically connected to a fourth power supply terminal; and the first capacitor, the second capacitor and the third capacitor have a same capacitance.

2. The shift register unit of claim 1, wherein the first pull-up voltage stabilizing circuit and the second pull-up voltage stabilizing circuit are collectively configured to maintain the voltage at the pull-up node unchanged during periods in which the at least two driving output circuits output the display driving pulses.

3. The shift register unit of claim 1, wherein the driving output circuit further comprises:

a corresponding driving clock signal input terminal and a corresponding driving signal output terminal, and configured to write a signal from the driving clock signal input terminal to the driving signal output terminal in response to an active level signal at the pull-up node; and the second terminal of the first capacitor is connected to the driving signal output terminal.

4. The shift register unit of claim 3, wherein during the period in which the first driving output circuit outputs the display driving pulse, m other driving output circuits of the at least two driving output circuits sequentially start outputting the display driving pulses, m is a positive integer;

the first pull-up voltage stabilizing circuit comprises: m first voltage stabilizing sub-circuits in one-to-one correspondence with the m other driving output circuits; and each first voltage stabilizing sub-circuit is connected to the pull-up node and a corresponding first voltage stabilizing clock signal input terminal, and is configured to maintain the voltage at the pull-up node unchanged by switching a signal, from the first voltage stabilizing clock signal input terminal, from a second level to a first level when the display driving pulse output by the driving output circuit corresponding to the first voltage stabilizing sub-circuit is switched from the first level to the second level.

5. The shift register unit of claim 4, wherein the fifty-first transistor is connected to a corresponding first voltage stabilizing clock signal input terminal, the pull-up node and the second terminal of the second capacitor, and is configured to write a signal, from the first voltage stabilizing clock signal input terminal and switching from the second level to the first level, to the second terminal of the second capacitor in response to an active level signal at the pull-up node when the display driving pulse output by the driving output circuit corresponding to the first transmission sub-circuit is switched from the first level to the second level; and a first electrode of the fifty-first transistor is connected to the corresponding first voltage stabilizing clock signal input terminal.

6. The shift register unit of claim 5, wherein the shift register circuit further comprises:

a pull-down control circuit connected to a second power supply terminal, an active level supply terminal, the pull-up node, and a pull-down node, and configured to write, to the pull-down node, a voltage with a phase opposite to that of the voltage at the pull-up node; and wherein the control electrode of the sixty-first transistor is connected to the pull-down node, and the sixty-first transistor is configured to write a non-active level signal from the fourth power supply terminal to the second terminal of the second capacitor in response to an active level signal at the pull-down node.

7. The shift register unit of claim 3, wherein during the period in which the last driving output circuit outputs the display driving pulse, n other driving output circuits of the at least two driving output circuits sequentially finish outputting the display driving pulses, n is a positive integer;

the second pull-up voltage stabilizing circuit comprises: n second voltage stabilizing sub-circuits in one-to-one correspondence with the n other driving output circuits; and each second voltage stabilizing sub-circuit is connected to the pull-up node and a corresponding second voltage stabilizing clock signal input terminal, and is configured to maintain the voltage at the pull-up node unchanged by a signal from the second voltage stabilizing clock signal input terminal and switching from the first level to the second level when the display driving pulse output by the driving output circuit corresponding to the second voltage stabilizing sub-circuit is switched from the second level to the first level.

8. The shift register unit of claim 7, wherein the fifty-second transistor is connected to the corresponding second voltage stabilizing clock signal input terminal, the pull-up node and the second terminal of the third capacitor, and is configured to write a signal, from the second voltage stabilizing clock signal input terminal and switching from the first level to the second level, to the second terminal of the third capacitor in response to an active level signal at the pull-up node when the display driving pulse output by the driving output circuit corresponding to the second transmission sub-circuit is switched from the second level to the first level; and a first electrode of the fifty-second transistor is connected to the corresponding first voltage stabilizing clock signal input terminal.

9. The shift register unit of claim 8, wherein the shift register circuit further comprises:

a pull-down control circuit connected to the second power supply terminal, the active level supply terminal, the pull-up node, and the pull-down node, and configured to write, to the pull-down node, a voltage with a phase opposite to that of the voltage at the pull-up node; and the sixty-second transistor is configured to write a non-active level signal from the fourth power supply terminal to the second terminal of the third capacitor in response to an active level signal at the pull-down node.

10. The shift register unit of claim 1, wherein the shift register circuit further comprises: at least one cascade output circuit; and each cascade output circuit of the at least one cascade output circuit is connected to the pull-up node, a corresponding cascade clock signal input terminal and a corresponding cascade signal output terminal, and is configured to write a signal from the cascade clock signal input terminal to the cascade signal output terminal in response to a voltage at the pull-up node;

wherein the shift register circuit further comprises:

a pull-down control circuit connected to a second power supply terminal, an active level supply terminal, the pull-up node and a pull-down node, and configured to write, to the pull-down node, a voltage with a phase opposite to that of the voltage at the pull-up node; and each cascade output circuit of the at least one cascade output circuit is further connected to the pull-down node and the second power supply terminal, and is further configured to write a non-active level signal from the second power supply terminal to the cascade signal output terminal in response to a voltage at the pull-down node;

wherein the shift register circuit further comprises:

a display reset circuit connected to a display reset signal input terminal, the second power supply terminal, and the pull-up node, and configured to write a non-active level signal from the second power supply terminal to the pull-up node in response to an active level signal from the display reset signal input terminal; and the at least one cascade output circuit comprises two cascade output circuits, one of the two cascade output circuits is configured to output a reset cascade pulse, and the other one of the two cascade output circuits is configured to output an input cascade pulse; and wherein a moment at which the cascade output circuit configured to output the reset cascade pulse starts outputting the reset cascade pulse precedes a moment at which the cascade output circuit configured to output the input cascade pulse starts outputting the input cascade pulse.

11. The shift register unit of claim 1, wherein the shift register circuit further comprises:

a display reset circuit connected to a display reset signal input terminal, a second power supply terminal, and the pull-up node, and configured to write a non-active level signal from the second power supply terminal to the pull-up node in response to an active level signal from the display reset signal input terminal; and a pull-down control circuit connected to the second power supply terminal, the active level supply terminal, the pull-up node, and the pull-down node, and configured to write, to the pull-down node, a voltage with a phase opposite to that of the voltage at the pull-up node;

each driving output sub-circuit is further connected to the pull-down node and the fourth power supply terminal, and is further configured to write a non-active level signal from the fourth power supply terminal to the driving signal output terminal in response to an active level signal at the pull-down node.

12. The shift register unit of claim 11, wherein the shift register circuit comprises two pull-down control circuits, which are a first pull-down control circuit and a second pull-down control circuit, respectively;

the shift register circuit comprises two pull-down nodes, which are a first pull-down node and a second pull-down node, respectively;

the shift register circuit comprises two active level supply terminals, which are a first active level supply terminal and a second active level supply terminal, respectively;

the first pull-down control circuit is connected to the first pull-down node and the first active level supply terminal, and the second pull-down control circuit is connected to the second pull-down node and the second active level supply terminal; and each driving output sub-circuit is connected to both the first pull-down node and the second pull-down node, and is configured to write a non-active level signal from the fourth power supply terminal to the driving signal output terminal when at least one of the first pull-down node and the second pull-down node is at an active level.

13. The shift register unit of claim 11, wherein the pull-down control circuit comprises: a thirty-seventh transistor, a thirty-eighth transistor, a thirty-ninth transistor, and a fortieth transistor;

a control electrode of the thirty-seventh transistor is connected to the active level supply terminal, a first electrode of the thirty-seventh transistor is connected to the control electrode of the thirty-seventh transistor, and a second electrode of the thirty-seventh transistor is connected to a control electrode of the thirty-eighth transistor;

the control electrode of the thirty-eighth transistor is connected to a first electrode of the fortieth transistor, a first electrode of the thirty-eighth transistor is connected to the active level supply terminal, and a second electrode of the thirty-eighth transistor is connected to the pull-down node;

a control electrode of the thirty-ninth transistor is connected to the pull-up node, a first electrode of the thirty-ninth transistor is connected to the pull-down node, and a second electrode of the thirty-ninth transistor is connected to a fifth power supply terminal; and a control electrode of the fortieth transistor is connected to the pull-up node, and a second electrode of the fortieth transistor is connected to the second power supply terminal; and wherein the pull-down control circuit further comprises: a forty-first transistor; the second electrode of the thirty-seventh transistor is connected to the control electrode of the thirty-eighth transistor through the forty-first transistor; and a control electrode of the forty-first transistor is connected to the control electrode of the thirty-seventh transistor, a first electrode of the forty-first transistor is connected to the second electrode of the thirty-seventh transistor, and a second electrode of the forty-first transistor is connected to the control electrode of the thirty-eighth transistor.

14. The shift register unit of claim 1, wherein the shift register circuit further comprises: a display input auxiliary circuit; the display input circuit is connected to the pull-up node through the display input auxiliary circuit, and the display input circuit and the display input auxiliary circuit are connected to each other at a display intermediate node; and the display input auxiliary circuit is further connected to a sixth power supply terminal, the display signal input terminal and the pull-up node, and is configured to write an active level signal from the sixth power supply terminal to the pull-up node in response to an active level signal from the display signal input terminal, and to electrically disconnect the display intermediate node from the pull-up node in response to a non-active level signal from the random signal input terminal, and to write an active level signal from the sixth power supply terminal to the display intermediate node;

wherein the display input auxiliary circuit comprises: a forty-second transistor and a forty-third transistor;

a control electrode of the forty-second transistor is connected to the display signal input terminal, a first electrode of the forty-second transistor is connected to the display intermediate node, and a second electrode of the forty-second transistor is connected to the pull-up node; and a control electrode of the forty-third transistor is connected to the sixth power supply terminal, a first electrode of the forty-third transistor is connected to the control electrode of the forty-third transistor, and a second electrode of the forty-third transistor is connected to the display intermediate node; and wherein the display input auxiliary circuit further comprises: a forty-fourth transistor through which the second electrode of the forty-third transistor is connected to the display intermediate node; and a control electrode of the forty-fourth transistor is connected to the control electrode of the forty-third transistor, a first electrode of the forty-fourth transistor is connected to a second electrode of the forty-fourth transistor, and the second electrode of the forty-fourth transistor is connected to the display intermediate node.

15. The shift register unit of claim 1, wherein the shift register circuit further comprises: a sensing control circuit and a sensing input circuit;

the sensing control circuit is connected to a sensing control node, a sensing signal input terminal and the random signal input terminal, and is configured to write a signal from the sensing signal input terminal to the sensing control node in response to an active level signal from the random signal input terminal; and the sensing input circuit is connected to the sensing control node, a clock control signal input terminal, a sensing intermediate node and the pull-up node, and is configured to write an active level signal to the sensing intermediate node in response to an active level signal at the sensing control node, and to form a conductive path between the sensing intermediate node and the pull-up node in response to an active level signal from the clock control signal input terminal;

wherein the shift register circuit further comprises: a sensing control leakage preventing circuit; and the sensing control circuit is connected to the sensing control node through the sensing control leakage preventing circuit; the sensing control leakage preventing circuit and the sensing control circuit are connected to each other at a sensing control leakage preventing node; the sensing control leakage preventing circuit is further connected to the first power supply terminal, the sensing control node and the random signal input terminal, and is configured to write an active level signal from the first power supply terminal to the sensing control leakage preventing node in response to an active level signal at the sensing control node, and is further configured to form a conductive path between the sensing control leakage preventing node and the sensing control node in response to an active level signal from the random signal input terminal, and electrically disconnect the sensing control leakage preventing node from the sensing control node in response to a non-active level signal from the random signal input terminal;

wherein the shift register circuit further comprises:

a first voltage control circuit connected to a third power supply terminal, the pull-up node and a first voltage control node, and configured to write an active level signal from the third power supply terminal to the first voltage control node in response to an active level signal at the pull-up node;

the shift register circuit further comprises: a sensing input leakage preventing circuit; and the sensing input circuit is connected to the pull-up node through the sensing input leakage preventing circuit; the sensing input circuit and the sensing input leakage preventing circuit are connected to each other at a sensing input leakage preventing node; the sensing input leakage preventing node is connected to the first voltage control node; the sensing input leakage preventing circuit is connected to the clock control signal input terminal, and is configured to form a conductive path between the sensing input leakage preventing node and the pull-up node in response to an active level signal from the clock control signal input terminal, and to electrically disconnect the sensing input leakage preventing node from the pull-up node in response to a non-active level signal from the clock control signal input terminal; and wherein the sensing input circuit comprises:

a first input sub-circuit connected to the sensing control node and the sensing intermediate node and configured to write an active level signal to the sensing intermediate node in response to an active level signal at the sensing control node;

a second input sub-circuit connected to the sensing intermediate node and the clock control signal input terminal, and configured to form a conductive path between the sensing intermediate node and the pull-up node in response to an active level signal from the clock control signal input terminal; and the shift register unit comprises two shift register circuits, which share a same sensing control circuit and a same first input sub-circuit.

16. The shift register unit of claim 1, wherein the shift register circuit further comprises:

a display reset circuit connected to a display reset signal input terminal, a second power supply terminal, and the pull-up node, and configured to write a non-active level signal from the second power supply terminal to the pull-up node in response to an active level signal from the display reset signal input terminal;

a pull-down control circuit connected to the second power supply terminal, the active level supply terminal, the pull-up node, and the pull-down node, and configured to write, to the pull-down node, a voltage with a phase opposite to that of the voltage at the pull-up node;

a pull-up noise reduction circuit connected to the second power supply terminal, the pull-up node and the pull-down node, and configured to write a non-active level signal from the second power supply terminal to the pull-up node in response to an active level signal at the pull-down node; and a global reset circuit connected to a global reset signal input terminal, the second power supply terminal, and the pull-up node, and configured to write a non-active level signal from the second power supply terminal to the pull-up node in response to an active level signal from the global reset signal input terminal;

wherein the driving output sub-circuit is further connected to the pull-down node and the fourth power supply terminal, and is further configured to write a non-active level signal from the fourth power supply terminal to the driving signal output terminal in response to an active level signal at the pull-down node.

17. The shift register unit of claim 16, wherein the shift register circuit further comprises:

a first voltage control circuit connected to a third power supply terminal, the pull-up node and a first voltage control node, and configured to write an active level signal from the third power supply terminal to the first voltage control node in response to an active level signal at the pull-up node;

the shift register circuit further comprises: at least one of a first leakage preventing circuit, a second leakage preventing circuit, and a third leakage preventing circuit;

the global reset circuit is connected to the second power supply terminal through the first leakage preventing circuit; the global reset circuit is connected to the first leakage preventing circuit at a first leakage preventing node; the first leakage preventing node is connected to the first voltage control node; the first leakage preventing circuit is connected to the global reset signal input terminal, and is configured to form a conductive path between the first leakage preventing node and the second power supply terminal in response to an active level signal from the global reset signal input terminal, and electrically disconnect the first leakage preventing node from the second power supply terminal in response to a non-active level signal from the global reset signal input terminal;

the display reset circuit is connected to the second power supply terminal through the second leakage preventing circuit; the display reset circuit and the second leakage preventing circuit are connected to each other at a second leakage preventing node; the second leakage preventing node is connected to the first voltage control node; the second leakage preventing circuit is connected to the display reset signal input terminal, and is configured to form a conductive path between the second leakage preventing node and the second power supply terminal in response to an active level signal from the display reset signal input terminal, and to electrically disconnect the second leakage preventing node from the second power supply terminal in response to a non-active level signal from the display reset signal input terminal; and the pull-up noise reduction circuit is connected to the second power supply terminal through the third leakage preventing circuit; the pull-up noise reduction circuit is connected to the third leakage preventing circuit at a third leakage preventing node; the third leakage preventing node is connected to the first voltage control node; the third leakage preventing circuit is connected to the pull-down node, and is configured to form a conductive path between the third leakage preventing node and the second power supply terminal in response to an active level signal at the pull-down node, and to electrically disconnect the third leakage preventing node from the second power supply terminal in response to a non-active level signal at the pull-down node.

18. A gate driving circuit, comprising: a plurality of shift register units, each of which is the shift register unit of claim 1, wherein a plurality of the shift register circuits of the plurality of shift register units are cascaded, and during the period in which the first driving output circuit outputs the display driving pulse, m other driving output circuits of the at least two driving output circuits sequentially start outputting the display driving pulses, m is a positive integer; the first pull-up voltage stabilizing circuit comprises: m first voltage stabilizing sub-circuits in one-to-one correspondence with the m other driving output circuits; and each first voltage stabilizing sub-circuit is connected to the pull-up node and a corresponding first voltage stabilizing clock signal input terminal, and is configured to maintain the voltage at the pull-up node unchanged by switching a signal, from the first voltage stabilizing clock signal input terminal, from a second level to a first level when the display driving pulse output by the driving output circuit corresponding to the first voltage stabilizing sub-circuit is switched from the first level to the second level, and the gate driving circuit further comprises: a plurality of clock supply signal lines for sequentially providing clock pulses;

the driving clock signal input terminal of each driving output circuit is connected to a corresponding clock supply signal line; and the first voltage stabilizing clock signal input terminal of the first voltage stabilizing sub-circuit is connected to a corresponding clock supply signal line.

19. A display panel, comprising: a base substrate and a gate driving circuit on the base substrate, wherein the gate driving circuit is the gate driving circuit of claim 18.

20. A gate driving circuit, comprising: a plurality of shift register units, each of which is the shift register unit of claim 1, wherein a plurality of the shift register circuits of the plurality of shift register units are cascaded, and during the period in which the last driving output circuit outputs the display driving pulse, n other driving output circuits of the at least two driving output circuits sequentially finish outputting the display driving pulses, n is a positive integer; the second pull-up voltage stabilizing circuit comprises: n second voltage stabilizing sub-circuits in one-to-one correspondence with the n other driving output circuits; and each second voltage stabilizing sub-circuit is connected to the pull-up node and a corresponding second voltage stabilizing clock signal input terminal, and is configured to maintain the voltage at the pull-up node unchanged by a signal from the second voltage stabilizing clock signal input terminal and switching from the first level to the second level when the display driving pulse output by the driving output circuit corresponding to the second voltage stabilizing sub-circuit is switched from the second level to the first level, and the gate driving circuit further comprises: a plurality of clock supply signal lines for sequentially providing clock pulses;

the driving clock signal input terminal of each driving output circuit is connected to a corresponding clock supply signal line; and the second voltage stabilizing clock signal input terminal of the second voltage stabilizing sub-circuit is connected to a corresponding clock supply signal line.

* * * * *